(12) United States Patent
Hou et al.

(10) Patent No.: US 12,272,735 B2
(45) Date of Patent: Apr. 8, 2025

(54) TRANSISTOR GATE STRUCTURES AND METHODS OF FORMING THE SAME

(71) Applicant: Taiwan Semiconductor Manufacturing Co., Ltd., Hsinchu (TW)

(72) Inventors: Cheng-Hao Hou, Hsinchu (TW); Che-Hao Chang, Hsinchu (TW); Da-Yuan Lee, Jhubei (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 413 days.

(21) Appl. No.: 17/686,793

(22) Filed: Mar. 4, 2022

(65) Prior Publication Data

US 2023/0139258 A1    May 4, 2023

Related U.S. Application Data

(60) Provisional application No. 63/275,495, filed on Nov. 4, 2021.

(51) Int. Cl.
| | |
|---|---|
| *H01L 29/423* | (2006.01) |
| *H01L 21/02* | (2006.01) |
| *H01L 21/311* | (2006.01) |
| *H01L 27/088* | (2006.01) |
| *H01L 29/06* | (2006.01) |
| *H01L 29/40* | (2006.01) |
| *H01L 29/49* | (2006.01) |
| *H01L 29/51* | (2006.01) |
| *H01L 29/786* | (2006.01) |

(52) U.S. Cl.
CPC .. *H01L 29/42392* (2013.01); *H01L 21/02356* (2013.01); *H01L 21/31111* (2013.01); *H01L 27/088* (2013.01); *H01L 29/0665* (2013.01); *H01L 29/401* (2013.01); *H01L 29/4966* (2013.01); *H01L 29/517* (2013.01); *H01L 29/78696* (2013.01)

(58) Field of Classification Search
None
See application file for complete search history.

(56) References Cited

U.S. PATENT DOCUMENTS

| 9,209,247 B2 | 12/2015 | Colinge et al. |
|---|---|---|
| 9,236,267 B2 | 1/2016 | De et al. |

(Continued)

FOREIGN PATENT DOCUMENTS

| CN | 113410178 A | 9/2021 |
|---|---|---|
| DE | 102020129561 A1 | 12/2021 |

(Continued)

OTHER PUBLICATIONS

Deshpande, Anand et al., "Annealing behavior of atomic layer deposited hafniun oxide on silicon: Changes at the interface," Journal of Applied Physics, vol. 99, May 11, 2006, 8 pages.

*Primary Examiner* — Anthony Ho
(74) *Attorney, Agent, or Firm* — Slater Matsil, LLP

(57) ABSTRACT

In an embodiment, a device includes: a first gate dielectric on a first channel region of a first semiconductor feature; a first gate electrode on the first gate dielectric; a second gate dielectric on a second channel region of a second semiconductor feature, the second gate dielectric having a greater crystallinity than the first gate dielectric; and a second gate electrode on the second gate dielectric.

20 Claims, 40 Drawing Sheets

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,847,427 B2 | 11/2020 | Kim et al. |
| 11,011,372 B2 | 5/2021 | Peng et al. |
| 11,538,805 B2 | 12/2022 | Chiu et al. |
| 2017/0278842 A1 | 9/2017 | Song et al. |
| 2021/0057216 A1 | 2/2021 | Peng et al. |
| 2021/0098457 A1 | 4/2021 | Cheng et al. |

FOREIGN PATENT DOCUMENTS

| | | |
|---|---|---|
| KR | 20190056715 A | 5/2019 |
| TW | 202109744 A | 3/2021 |

Figure 14A  Figure 14B  Figure 14C  Figure 14D

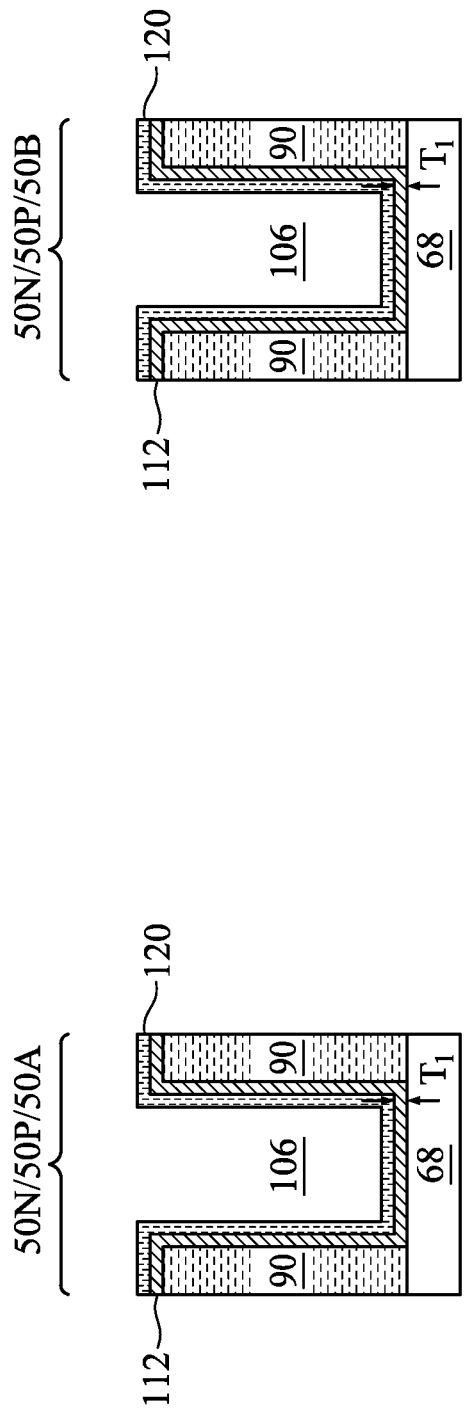
Figure 15A
Figure 15B
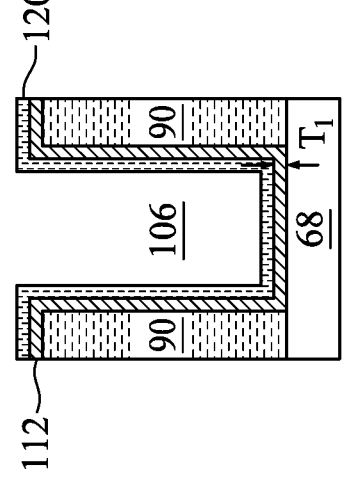
Figure 15C
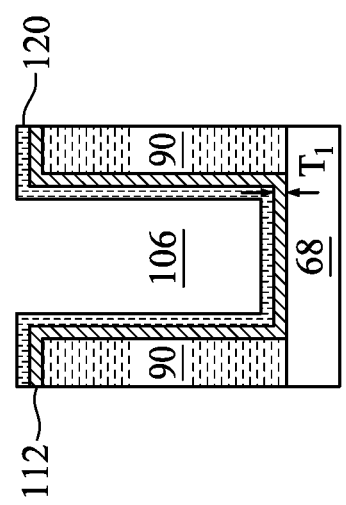
Figure 15D

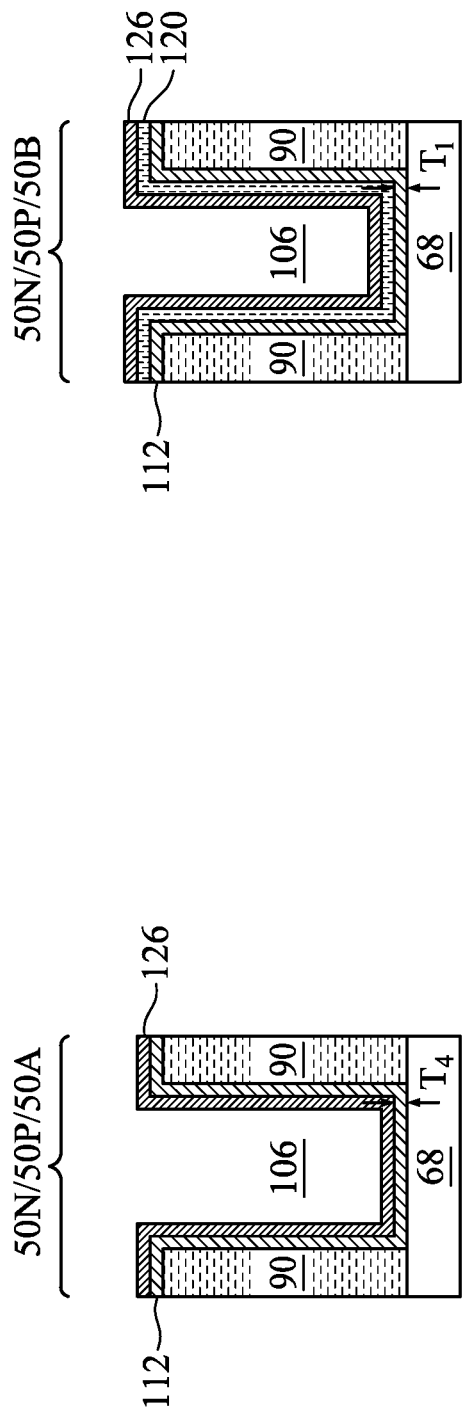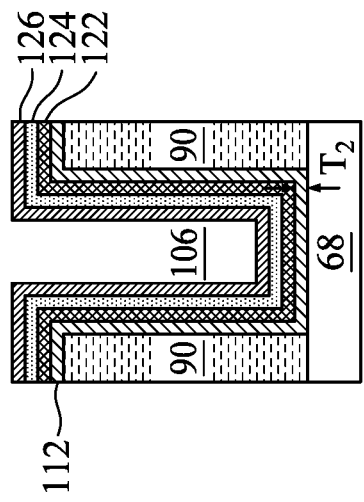
Figure 21A
Figure 21B
Figure 21C
Figure 21D

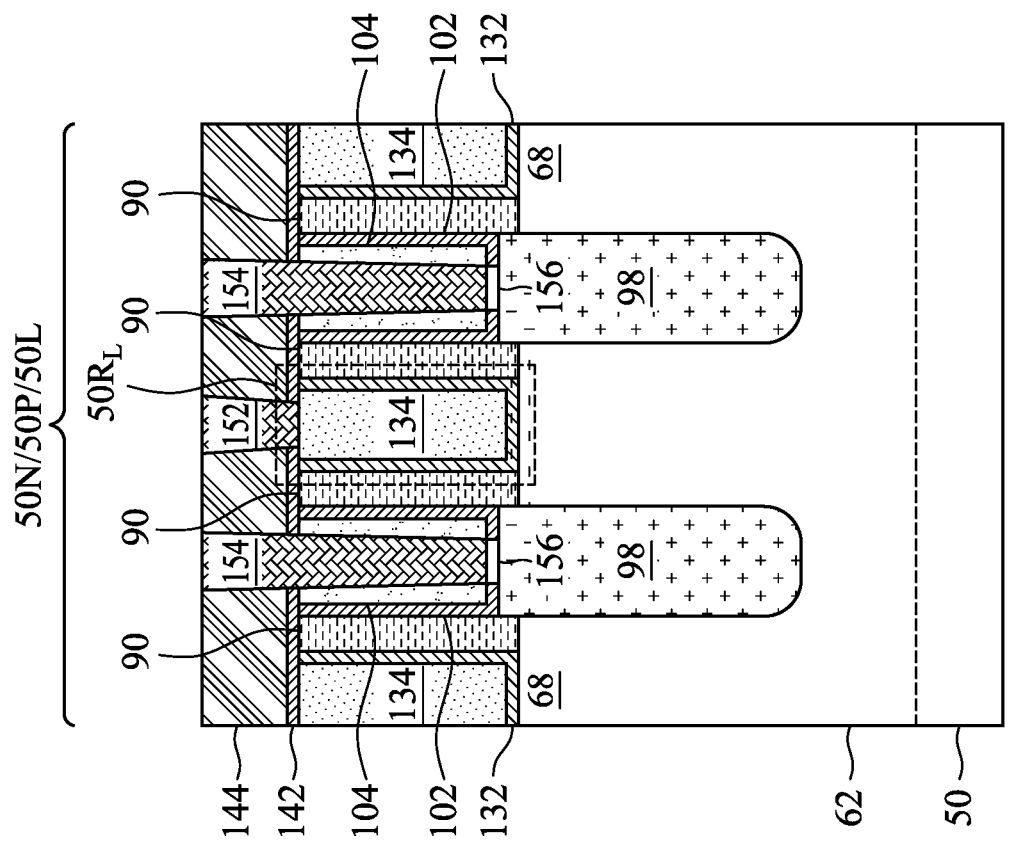
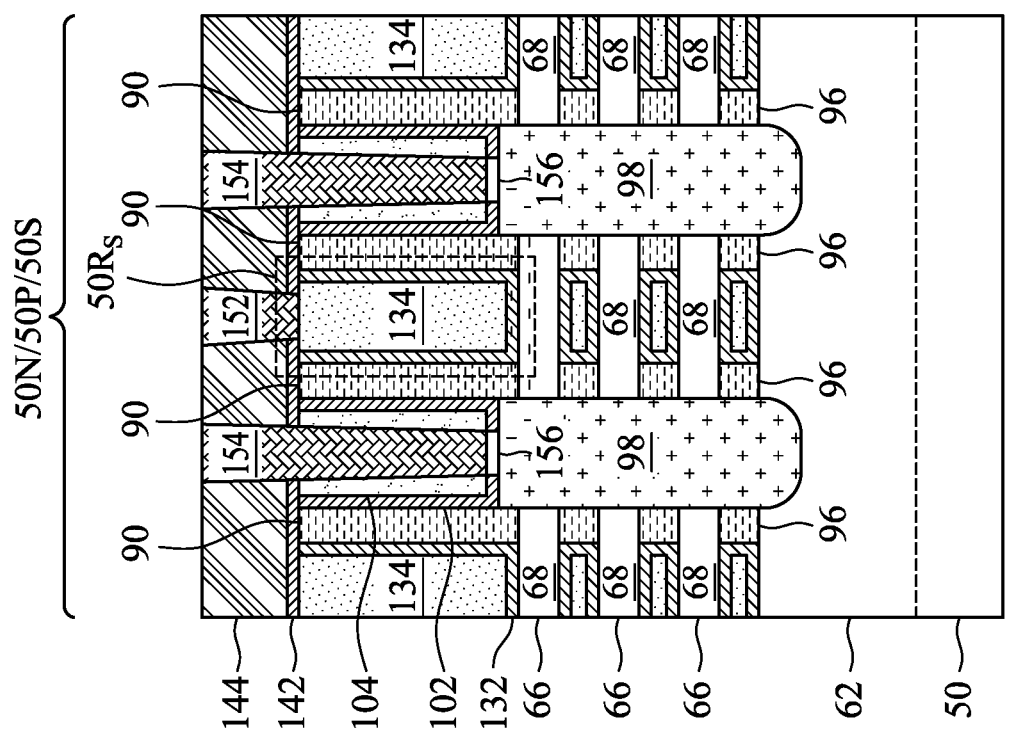
Figure 31B
Figure 31A

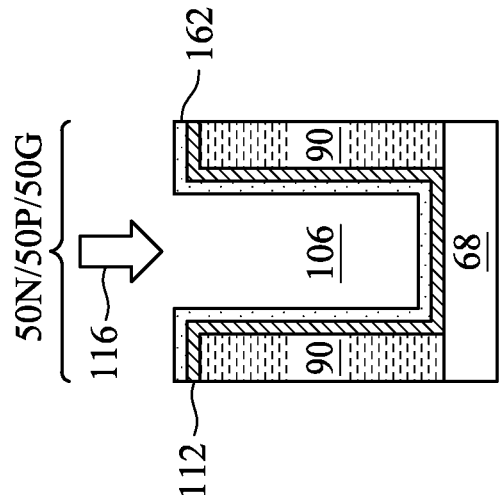
Figure 34A
Figure 34B
Figure 34C

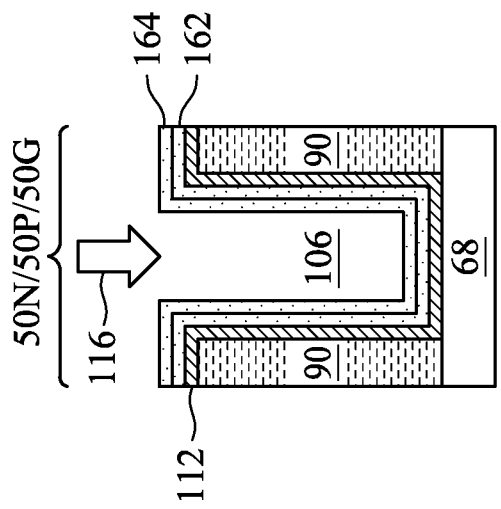
Figure 36A
Figure 36C
Figure 36B

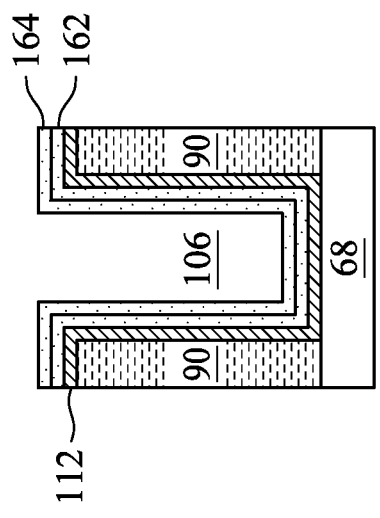
Figure 37A
Figure 37B
Figure 37C

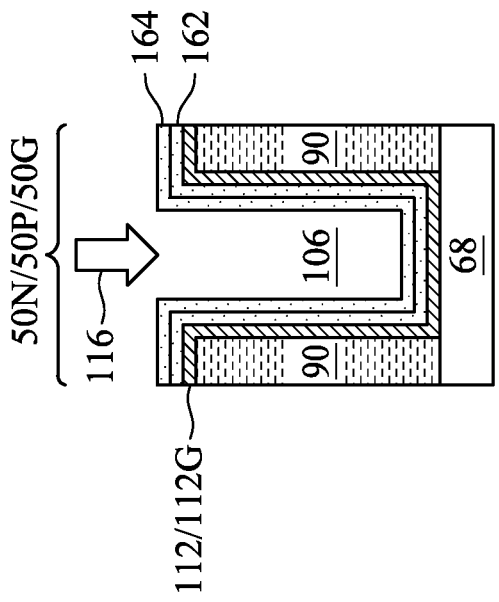
Figure 38A
Figure 38B
Figure 38C

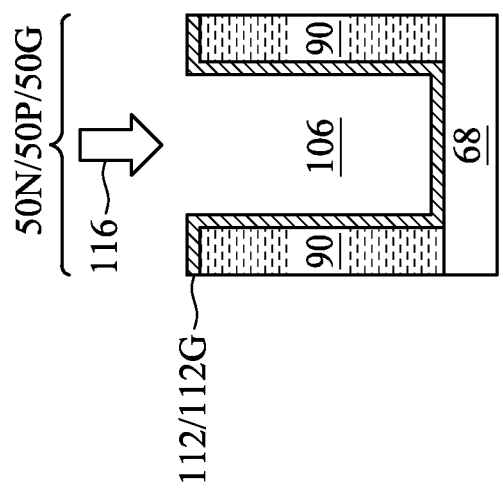
Figure 39A
Figure 39B
Figure 39C

TRANSISTOR GATE STRUCTURES AND METHODS OF FORMING THE SAME

PRIORITY CLAIM AND CROSS-REFERENCE

This application claims the benefit of U.S. Provisional Application No. 63/275,495, filed on Nov. 4, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-25B are views of intermediate stages in the manufacturing of nanostructure-FETs, in accordance with some embodiments.

FIGS. 31A-31B are views of devices, in accordance with some embodiments.

FIGS. 34A-39C are views of intermediate stages in the manufacturing of devices, in accordance with some embodiments.

DETAILED DESCRIPTION

Figure 1:
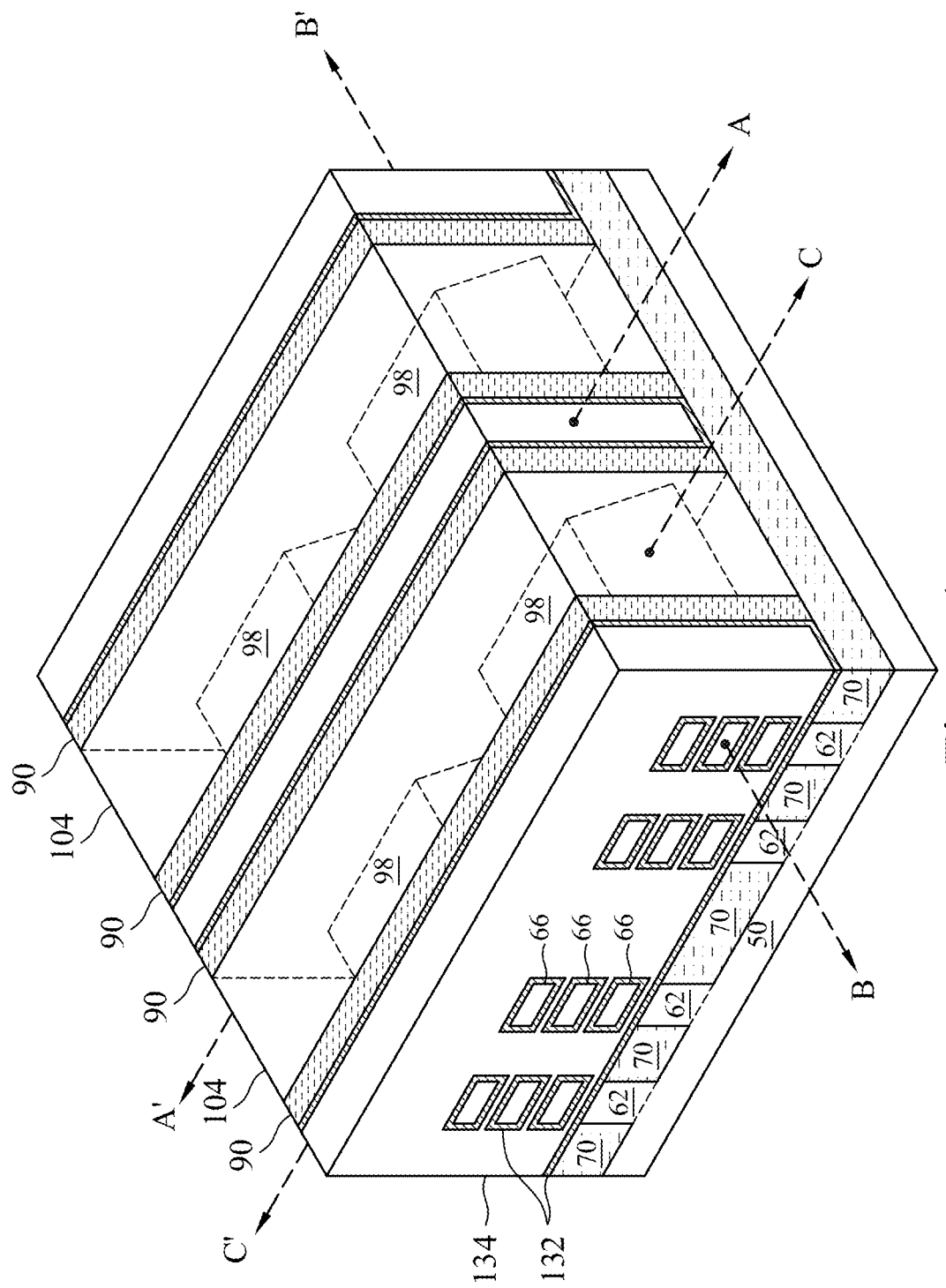
FIG. 1 illustrates an example of a nanostructure field-effect transistor (nanostructure-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, transistor replacement gates include gate dielectric layers and gate electrode layers. During formation of the gate dielectric layers, a crystallization process is performed to decrease the etch rate of the gate dielectric layers relative etch processes that will subsequently be used to pattern work function tuning layers for the gate electrode layers. Put another way, the crystallization process increases the etching selectivity of the gate dielectric layers from the etching of the work function tuning layers. The gate dielectric layers are used as etch stop layers during the etch processes for patterning of the work function tuning layers, and decreasing the etch rate of the gate dielectric layers helps reduce losses of the gate dielectric layers during the etch processes. Reducing losses of the gate dielectric layers may improve the performance of the resulting devices.

Embodiments are described in a particular context, a die including nanostructure field-effect transistor (nanostructure-FETs). Various embodiments may be applied, however, to dies including other types of transistors (e.g., fin field-effect transistors (FinFETs), planar transistors, or the like) in lieu of or in combination with the nanostructure-FETs.

FIG. 1 illustrates an example of nanostructure-FETs (e.g., nanowire FETs, nanosheet FETs, multi bridge channel (MBC) FETs, nano ribbon FETs, gate-all-around (GAA) FETs, or the like), in accordance with some embodiments. FIG. 1 is a three-dimensional view, where some features of the nanostructure-FETs are omitted for illustration clarity.

The nanostructure-FETs include nanostructures 66 (e.g., nanosheets, nanowires, or the like) over fins 62 on a substrate 50 (e.g., a semiconductor substrate), with the nanostructures 66 being semiconductor features which act as channel regions for the nanostructure-FETs. The nanostructures 66 may include p-type nanostructures, n-type nanostructures, or a combination thereof. Isolation regions 70, such as shallow trench isolation (STI) regions, are disposed between adjacent fins 62, and the nanostructures 66 are disposed over and between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials.

Gate dielectrics 132 are wrapped around the top surfaces, sidewalls, and bottom surfaces of the nanostructures 66. Gate electrodes 134 are over and wrapped around the gate dielectrics 132. Epitaxial source/drain regions 98 are disposed at opposing sides of the gate dielectrics 132 and the gate electrodes 134. An inter-layer dielectric (ILD) 104 is formed over the epitaxial source/drain regions 98. Contacts (subsequently described) to the epitaxial source/drain regions 98 will be formed through the ILD 104. The epitaxial source/drain regions 98 may be shared between various nanostructures 66. For example, adjacent epitaxial source/drain regions 98 may be electrically connected, such as through coalescing the epitaxial source/drain regions 98 by epitaxial growth, or through coupling the epitaxial source/drain regions 98 with a same source/drain contact.

FIG. 1 further illustrates reference cross-sections that are used in later figures. Cross-section A-A' is along a longitudinal axis of a gate electrode 134 and in a direction, for example, perpendicular to a direction of current flow between the epitaxial source/drain regions 98 of a nanostructure-FET. Cross-section B-B' is along a longitudinal axis of a nanostructure 66 and in a direction of, for example, a current flow between the epitaxial source/drain regions 98 of the nanostructure-FET. Cross-section C-C' is parallel to cross-section A-A' and extends through epitaxial source/drain regions 98 of the nanostructure-FETs. Subsequent figures refer to these reference cross-sections for clarity.

Some embodiments discussed herein are discussed in the context of nanostructure-FETs formed using a gate-last process. In other embodiments, a gate-first process may be used. Also, some embodiments contemplate aspects used in planar devices, such as planar FETs, or in fin field-effect transistors (FinFETs). For example, FinFETs may include semiconductor fins on a substrate, with the semiconductor fins being semiconductor features which act as channel regions for the FinFETs. Similarly, planar FETs may include a substrate, with planar portions of the substrate being semiconductor features which act as channel regions for the planar FETs.

FIGS. 2-25B are views of intermediate stages in the manufacturing of nanostructure-FETs, in accordance with some embodiments. FIGS. 2, 3, 4, 5, and 6 are three-dimensional views showing a similar three-dimensional view as FIG. 1. FIGS. 7A, 8A, 9A, 10A, 11A, 12A, 13A, 23A, 24A, and 25A are cross-sectional views illustrated along a similar cross-section as reference cross-section A-A' in FIG. 1, except two fins are shown. FIGS. 7B, 8B, 9B, 10B, 11B, 12B, 13B, 14A, 14B, 14C, 14D, 15A, 15B, 15C, 15D, 16A, 16B, 16C, 16D, 17A, 17B, 17C, 17D, 18A, 18B, 18C, 18D, 19A, 19B, 19C, 19D, 20A, 20B, 20C, 20D, 21A, 21B, 21C, 21D, 22A, 22B, 22C, 22D, 23B, 24B, and 25B are cross-sectional views illustrated along a similar cross-section as reference cross-section B-B' in FIG. 1. FIGS. 9C and 9D are cross-sectional views illustrated along a similar cross-section as reference cross-section C-C' in FIG. 1, except two fins are shown.

Figure 2:
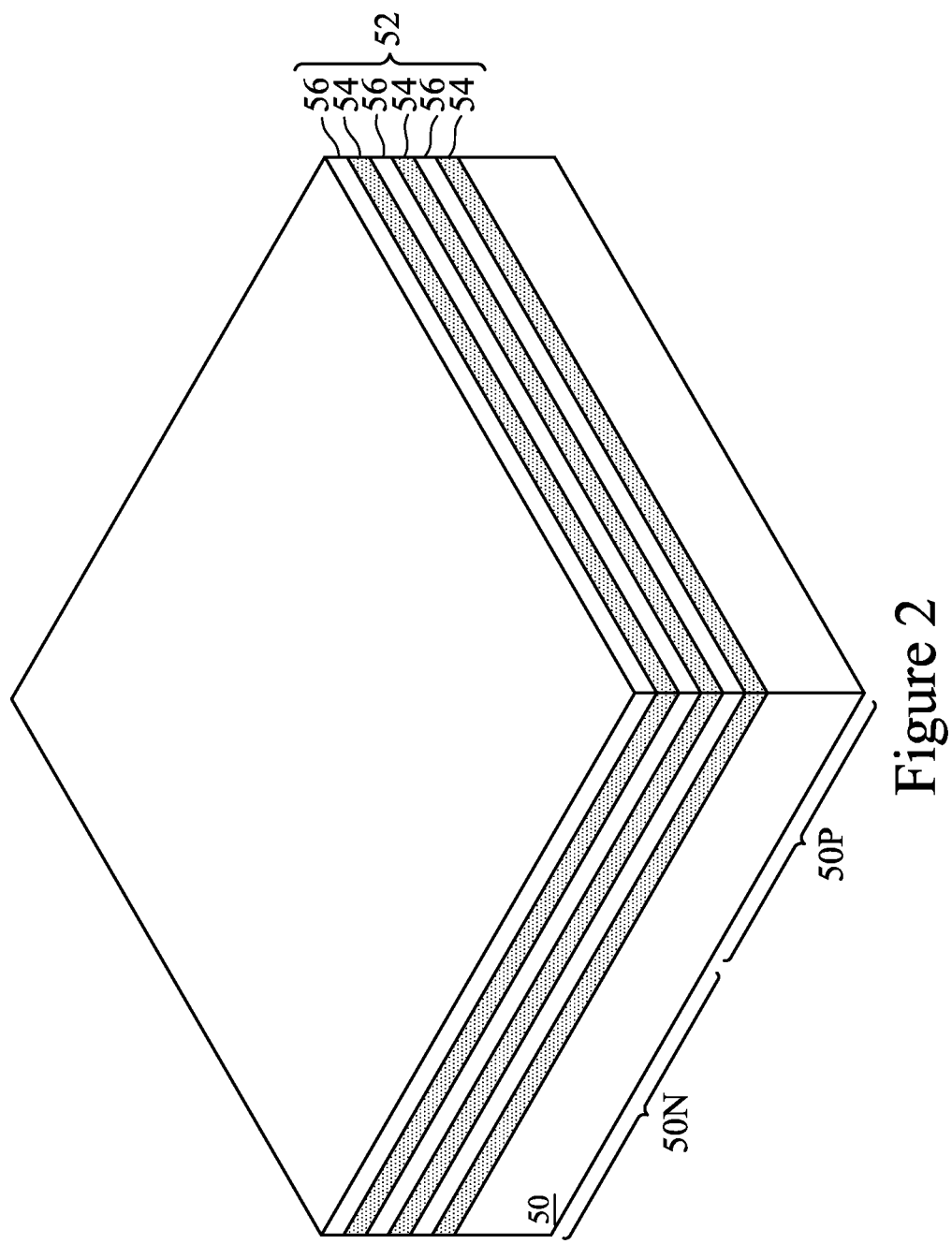

In FIG. 2, a substrate 50 is provided for forming nanostructure-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

The substrate 50 has an n-type region 50N and a p-type region 50P. The n-type region 50N can be for forming n-type devices, such as NMOS transistors, e.g., n-type nanostructure-FETs, and the p-type region 50P can be for forming p-type devices, such as PMOS transistors, e.g., p-type nanostructure-FETs. The n-type region 50N may be physically separated from the p-type region 50P (not separately illustrated), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

The substrate 50 may be lightly doped with a p-type or an n-type impurity. An anti-punch-through (APT) implantation may be performed on an upper portion of the substrate 50 to form an APT region. During the APT implantation, impurities may be implanted in the substrate 50. The impurities may have a conductivity type opposite from a conductivity type of source/drain regions that will be subsequently formed in the n-type region 50N and the p-type region 50P. The APT region may extend under the source/drain regions in the nanostructure-FETs. The APT region may be used to reduce the leakage from the source/drain regions to the substrate 50. In some embodiments, the impurity concentration in the APT region may be in the range of $10^{18}$ cm$^{-3}$ to $10^{19}$ cm$^{-3}$.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50. In the illustrated embodiment, the multi-layer stack 52 includes three layers of each of the first semiconductor layers 54 and the second semiconductor layers 56. It should be appreciated that the multi-layer stack 52 may include any number of the first semiconductor layers 54 and the second semiconductor layers 56.

In the illustrated embodiment, and as will be subsequently described in greater detail, the first semiconductor layers 54 will be removed and the second semiconductor layers 56 will patterned to form channel regions for the nanostructure-FETs in both the n-type region 50N and the p-type region 50P. The first semiconductor layers 54 are sacrificial layers (or dummy layers), which will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nanostructure-FETs in one region (e.g., the p-type region 50P), and the second semiconductor layers 56 will be patterned to form channel regions for nanostructure-FETs in another region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without removing the second semiconductor layers 56 in the n-type region 50N, and the second semiconductor layers 56 may be removed without removing the first semiconductor layers 54 in the p-type region 50P.

Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. Each of the layers may have a small thickness, such as a thickness in the range of 5 nm to 30 nm. In some embodiments, some layers of the multi-layer stack 52 (e.g., the second semiconductor layers 56) are formed to be thinner than other layers of the multi-layer stack 52 (e.g., the first semiconductor layers 54).

Figure 3:
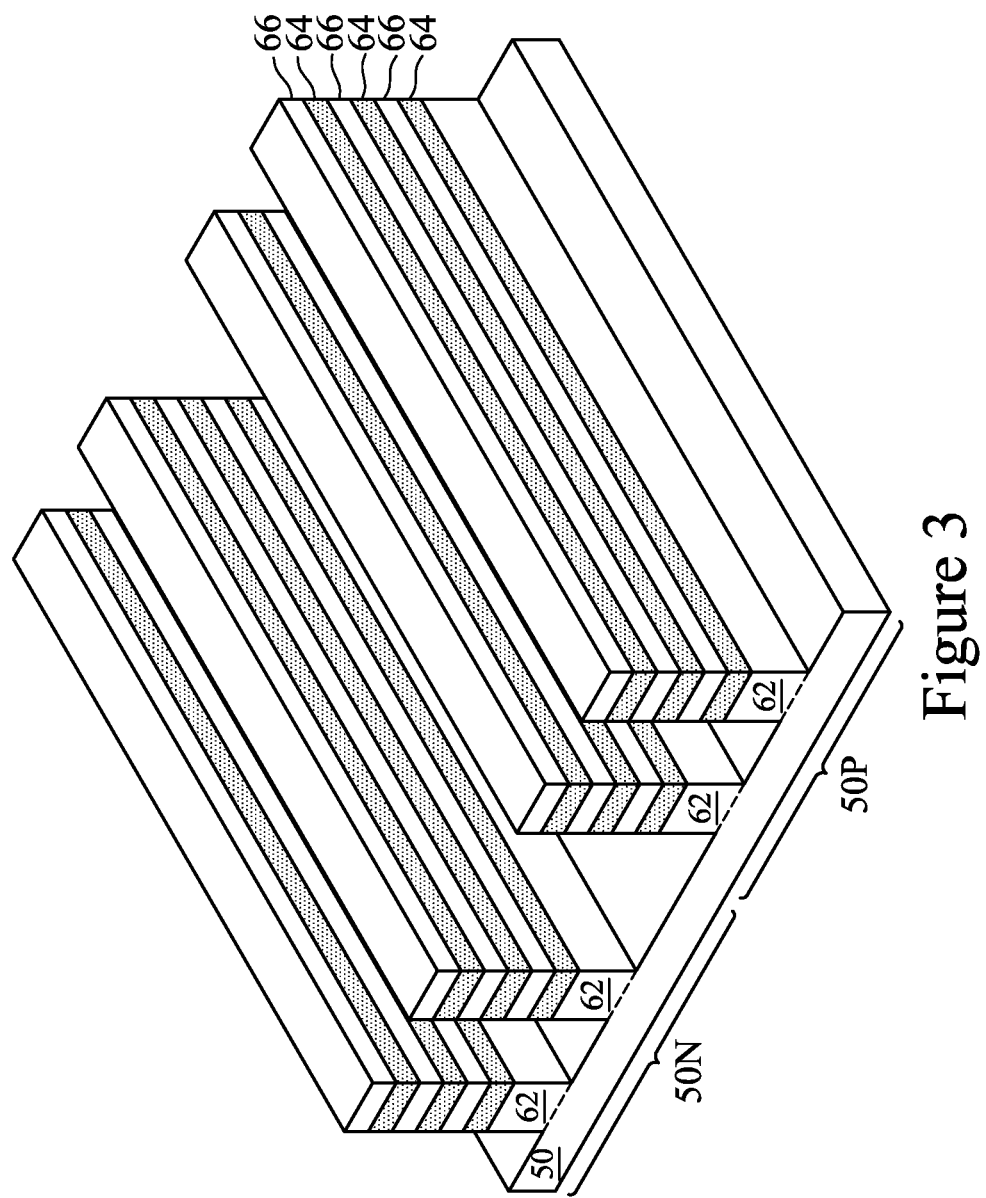

In FIG. 3, trenches are patterned in the substrate 50 and the multi-layer stack 52 to form fins 62, first nanostructures 64, and second nanostructures 66. The fins 62 are semiconductor strips patterned in the substrate 50. The first nanostructures 64 and the second nanostructures 66 include the remaining portions of the first semiconductor layers 54 and the second semiconductor layers 56, respectively. The trenches may be patterned by any acceptable etch process, such as a reactive ion etch (RIE), neutral beam etch (NBE), the like, or a combination thereof. The etching may be anisotropic.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the nanostructures 64, 66. In some embodiments, the mask (or other layer) may remain on the nanostructures 64, 66.

The fins 62 and the nanostructures 64, 66 may each have widths in the range of 8 nm to 40 nm. In the illustrated embodiment, the fins 62 and the nanostructures 64, 66 have substantially equal widths in the n-type region 50N and the p-type region 50P. In another embodiment, the fins 62 and the nanostructures 64, 66 in one region (e.g., the n-type region 50N) are wider or narrower than the fins 62 and the nanostructures 64, 66 in another region (e.g., the p-type region 50P).

Figure 4:
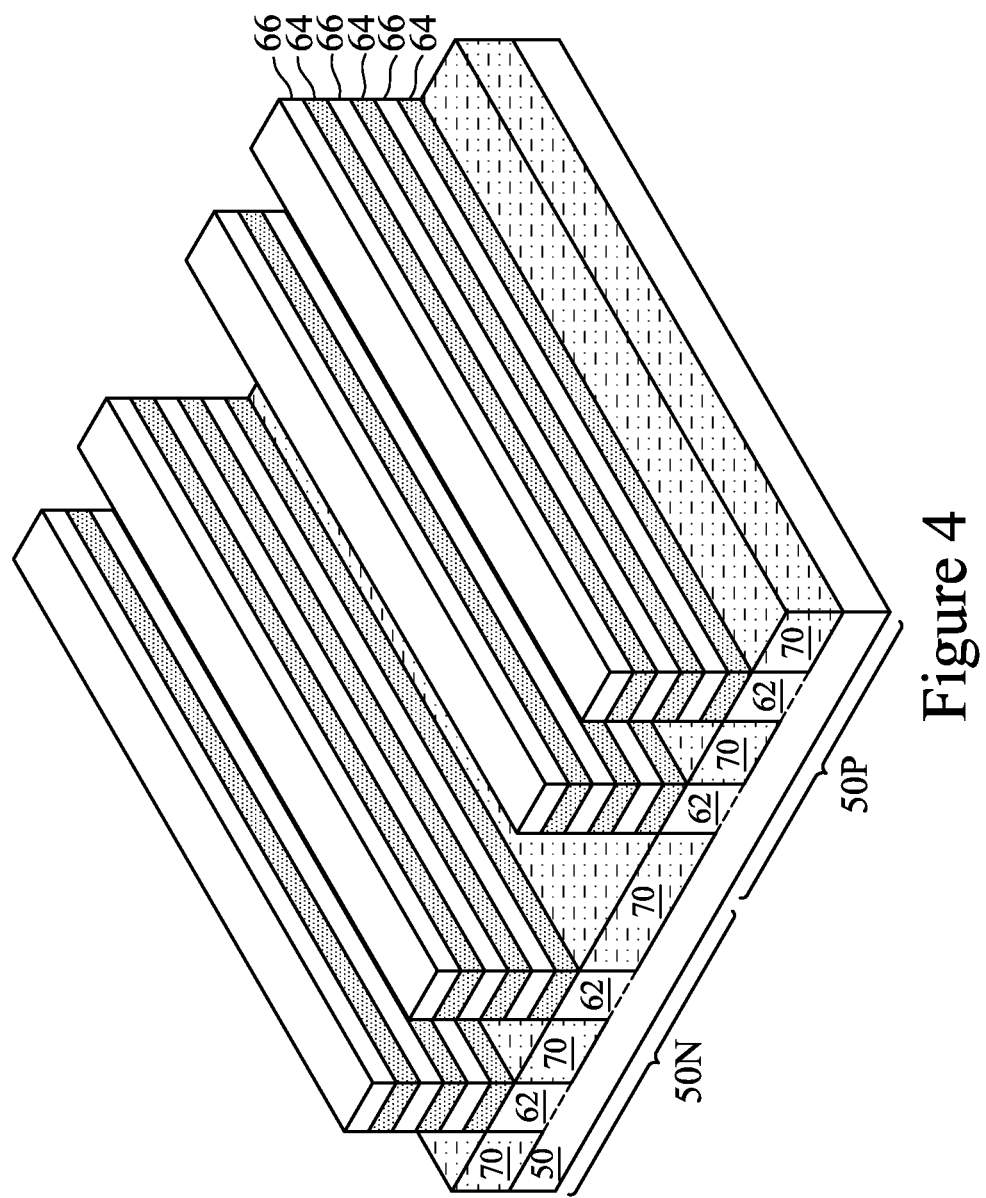

In FIG. 4, STI regions 70 are formed over the substrate 50 and between adjacent fins 62. The STI regions 70 are disposed around at least a portion of the fins 62 such that at least a portion of the nanostructures 64, 66 protrude from between adjacent STI regions 70. Portions of the fins 62 may also protrude from between adjacent STI regions 70. In the illustrated embodiment, the top surfaces of the STI regions 70 are coplanar (within process variations) with the top surfaces of the fins 62. In some embodiments, the top surfaces of the STI regions 70 are above or below the top surfaces of the fins 62. The STI regions 70 separate the features of adjacent nanostructure-FETs.

The STI regions 70 may be formed by any suitable method. For example, an insulation material can be formed over the substrate 50 and the nanostructures 64, 66, and between adjacent fins 62. The insulation material may be an oxide, such as silicon oxide, a nitride, such as silicon nitride, the like, or a combination thereof, which may be formed by a chemical vapor deposition (CVD) process, such as high-density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the nanostructures 64, 66. Although the STI regions 70 are each illustrated as a single layer, some embodiments may utilize multiple layers. For example, in some embodiments a liner (not separately illustrated) may first be formed along surfaces of the substrate 50, the fins 62, and the nanostructures 64, 66. Thereafter, a fill material may be formed over the liner.

A removal process is then applied to the insulation material to remove excess insulation material over the nanostructures 64, 66. In some embodiments, a planarization process such as a chemical mechanical polish (CMP), an etch-back process, combinations thereof, or the like may be utilized. In embodiments in which a mask remains on the nanostructures 64, 66, the planarization process may expose the mask or remove the mask. After the planarization process, the top surfaces of the insulation material and the mask (if present) or the nanostructures 64, 66 are coplanar (within process variations). Accordingly, the top surfaces of the mask (if present) or the nanostructures 64, 66 are exposed through the insulation material. In the illustrated embodiment, no mask remains on the nanostructures 64, 66. The insulation material is then recessed to form the STI regions 70. The insulation material is recessed such that at least a portion of the nanostructures 64, 66 protrude from between adjacent portions of the insulation material. Portions of the fins 62 may also protrude from between adjacent portions of the insulation material. Further, the top surfaces of the STI regions 70 may have a flat surface as illustrated, a convex surface, a concave surface (such as dishing), or a combination thereof. The top surfaces of the STI regions 70 may be formed flat, convex, and/or concave by an appropriate etch. The insulation material may be recessed using any acceptable etch process, such as one that is selective to the material of the insulation material (e.g., selectively etches the insulation material of the STI regions 70 at a faster rate than the materials of the fins 62 and the nanostructures 64, 66). For example, an oxide removal may be performed using dilute hydrofluoric (dHF) acid.

The process previously described is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the nanostructures 64, 66, the fins 62, and/or the substrate 50 by doping (e.g., with a p-type or an n-type impurity). The wells may have a conductivity type opposite from a conductivity type of source/drain regions that will be subsequently formed in the n-type region 50N and the p-type region 50P. In some embodiments, a p-type well is formed in the n-type region 50N, and an n-type well is formed in the p-type region 50P. In some embodiments, a p-type well or an n-type well is formed in both the n-type region 50N and the p-type region 50P.

In embodiments with different well types, different implant steps for the n-type region 50N and the p-type region 50P may be achieved using a mask (not separately illustrated) such as a photoresist. For example, a photoresist may be formed over the fins 62, the nanostructures 64, 66, and the STI regions 70 in the n-type region 50N. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in the range of $10^{13}$ cm$^{-3}$ to $10^{14}$ cm$^{-3}$. After the implant, the photoresist may be removed, such as by any acceptable ashing process.

Following or prior to the implanting of the p-type region 50P, a mask (not separately illustrated) such as a photoresist is formed over the fins 62, the nanostructures 64, 66, and the STI regions 70 in the p-type region 50P. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in the range of $10^{13}$ cm$^{-3}$ to $10^{14}$ cm$^{-3}$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments where epitaxial structures are epitaxially grown for the fins 62 and/or the nanostructures 64, 66, the grown materials may be in situ doped during growth, which may obviate the implantations, although in situ and implantation doping may be used together.

Figure 5:
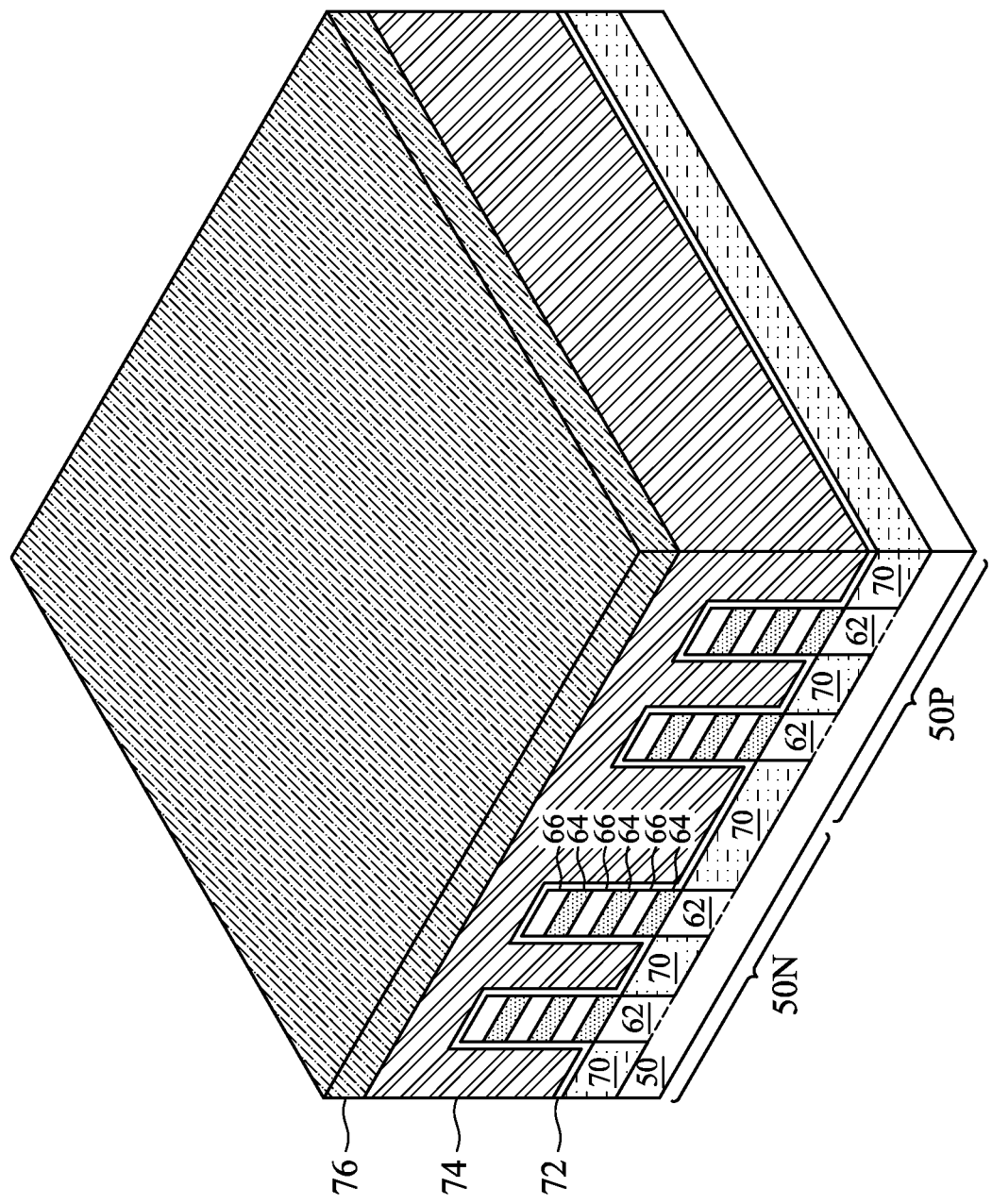

In FIG. 5, a dummy dielectric layer 72 is formed on the fins 62 and the nanostructures 64, 66. The dummy dielectric layer 72 may be formed of a dielectric material such as silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a CMP. The dummy gate layer 74 may be formed of a conductive or non-conductive material, such as amorphous silicon, polycrystalline silicon (polysilicon), polycrystalline silicon germanium (poly-SiGe), a metal, a metallic nitride, a metallic silicide, a metallic oxide, or the like, which may be formed by a deposition process such as physical vapor deposition (PVD), CVD, or the like. The dummy gate layer 74 may be formed of material(s) that have a high etching selectivity from the etching of insulation materials, e.g., the STI regions 70 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the fins 62, the nanostructures 64, 66, and the STI regions 70, such that the dummy dielectric layer 72 extends over the STI regions 70 and between the dummy gate layer 74 and the STI regions 70. In another embodiment, the dummy dielectric layer 72 covers only the fins 62 and the nanostructures 64, 66.

Figure 6:
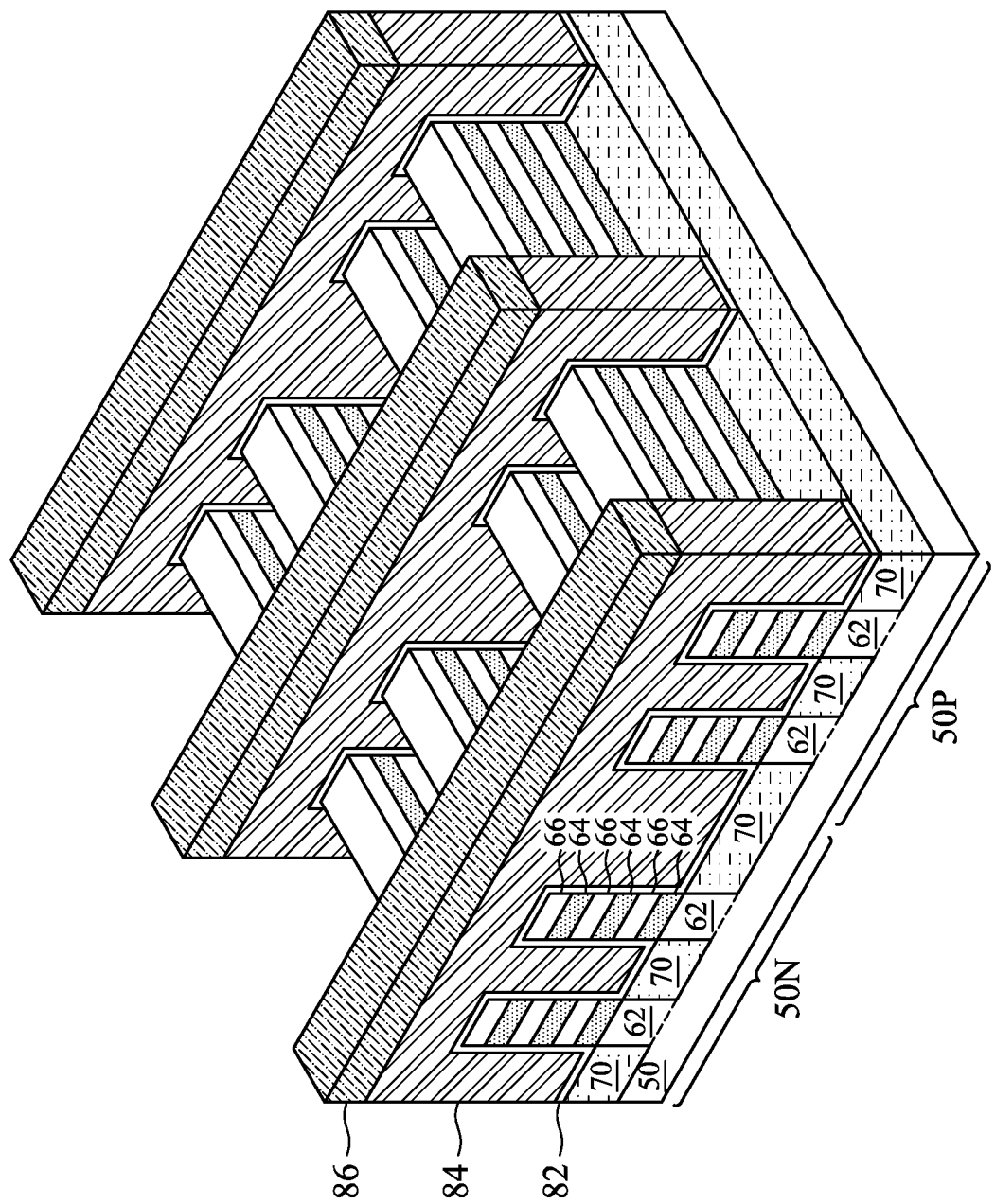

In FIG. 6, the mask layer 76 is patterned using acceptable photolithography and etching techniques to form masks 86. The pattern of the masks 86 is then transferred to the dummy gate layer 74 by any acceptable etching technique to form dummy gates 84. The pattern of the masks 86 may optionally be further transferred to the dummy dielectric layer 72 by any acceptable etching technique to form dummy dielectrics 82. The dummy gates 84 cover portions of the nanostructures 64, 66 that will be exposed in subsequent processing to form channel regions. Specifically, the dummy gates 84 extend along the portions of the second nanostructures 66 that will be patterned to form channel regions 68 (see FIGS. 7A-7B). The pattern of the masks 86 may be used to physically separate adjacent dummy gates 84. The dummy gates 84 may also have lengthwise directions substantially perpendicular (within process variations) to the lengthwise directions of the fins 62. The masks 86 can optionally be removed after patterning, such as by any acceptable etching technique.

FIGS. 7A-26B illustrate various additional steps in the manufacturing of embodiment devices. FIGS. 7A-26B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P are explained in the description accompanying each figure.

Figure 7A:
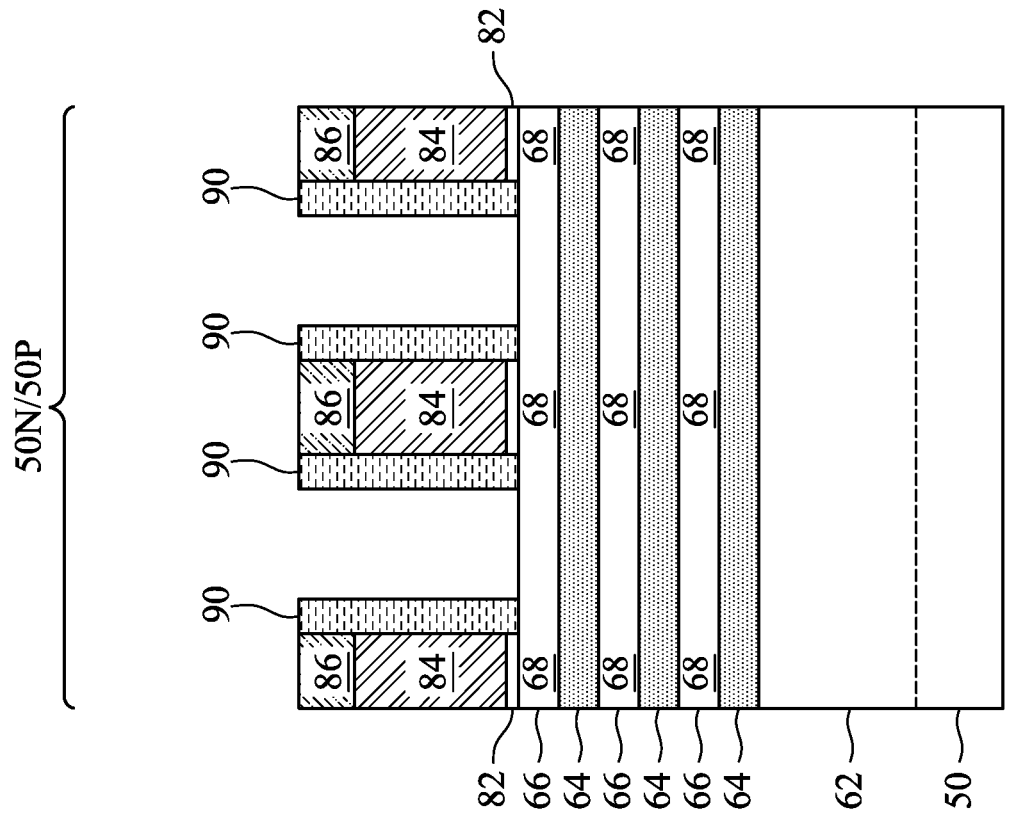
Figure 7B:
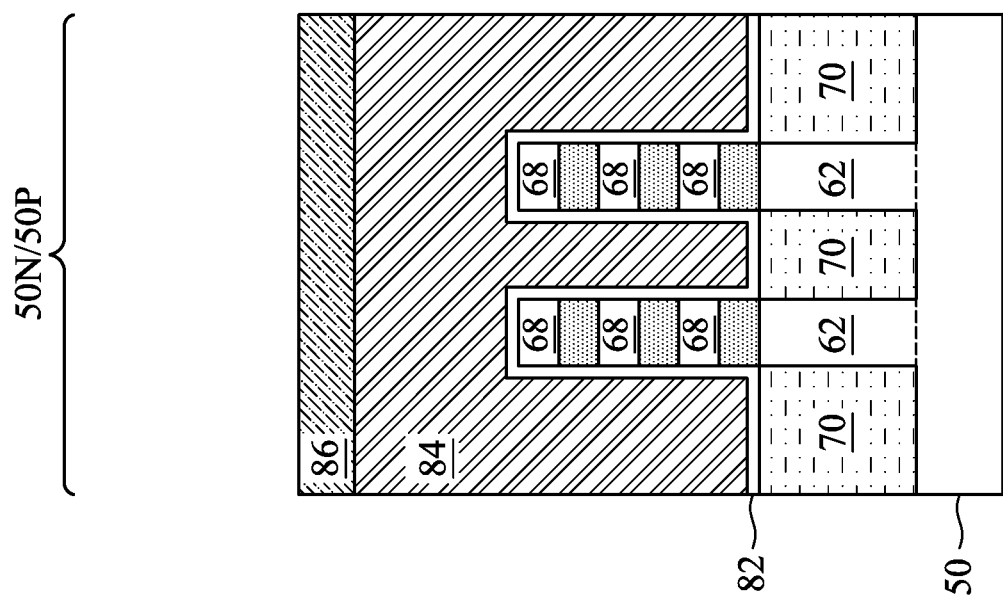

In FIGS. 7A-7B, gate spacers 90 are formed over the nanostructures 64, 66, on exposed sidewalls of the masks 86 (if present), the dummy gates 84, and the dummy dielectrics 82. The gate spacers 90 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 90). As will be subsequently described in greater detail, the dielectric material(s), when etched, may also have portions left on the sidewalls of the fins 62 and/or the nanostructures 64, 66 (thus forming fin spacers 92, see FIGS. 9C-9D). After etching, the fin spacers 92 and/or the gate spacers 90 can have straight sidewalls (as illustrated) or can have curved sidewalls (not separately illustrated).

Further, implants may be performed to form lightly doped source/drain (LDD) regions (not separately illustrated). In the embodiments with different device types, similar to the implants for the wells previously described, a mask (not separately illustrated) such as a photoresist may be formed over the n-type region 50N, while exposing the p-type region 50P, and appropriate type (e.g., p-type) impurities may be implanted into the fins 62 and/or the nanostructures 64, 66 exposed in the p-type region 50P. The mask may then be removed. Subsequently, a mask (not separately illustrated) such as a photoresist may be formed over the p-type region 50P while exposing the n-type region 50N, and appropriate type (e.g., n-type) impurities may be implanted into the fins 62 and/or the nanostructures 64, 66 exposed in the n-type region 50N. The mask may then be removed. The n-type impurities may be any of the n-type impurities previously described, and the p-type impurities may be any of the p-type impurities previously described. During the implanting, the channel regions 68 remain covered by the dummy gates 84, so that the channel regions 68 remain substantially free of the impurity implanted to form the LDD regions. The LDD regions may have a concentration of impurities in the range of $10^{15}$ cm$^{-3}$ to $10^{19}$ cm$^{-3}$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Figure 8B:
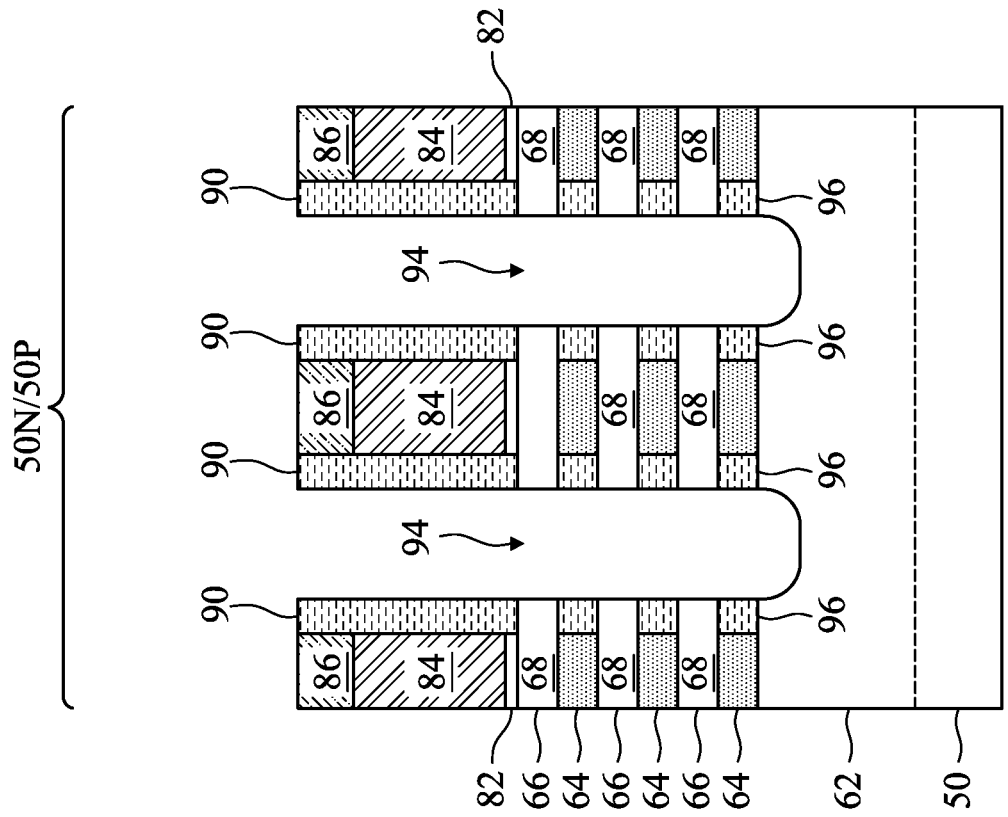
Figure 8A:
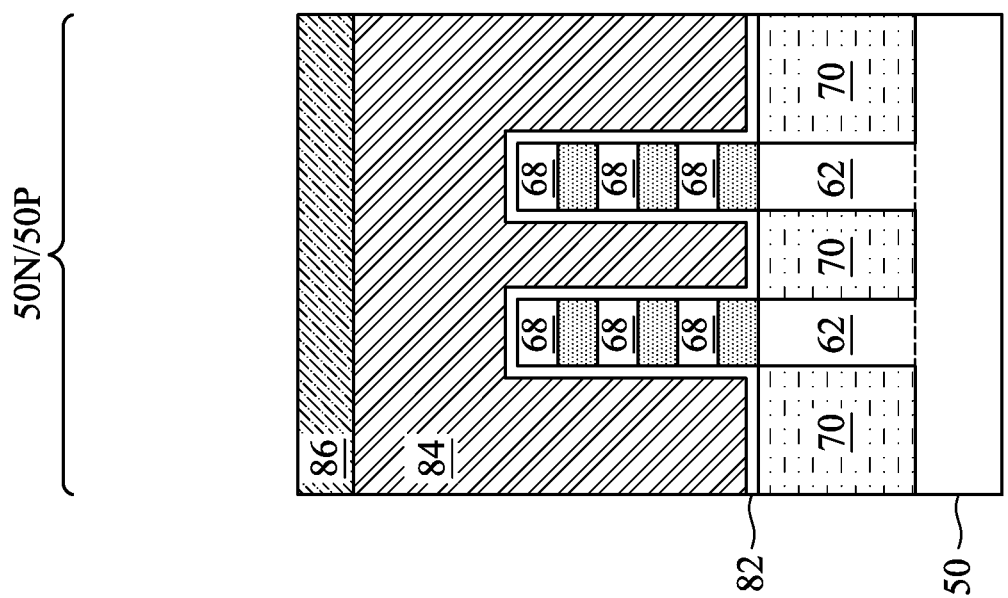

In FIGS. 8A-8B, source/drain recesses 94 are formed in the nanostructures 64, 66. In the illustrated embodiment, the source/drain recesses 94 extend through the nanostructures 64, 66 and into the fins 62. The source/drain recesses 94 may also extend into the substrate 50. In various embodiments, the source/drain recesses 94 may extend to a top surface of the substrate 50 without etching the substrate 50; the fins 62 may be etched such that bottom surfaces of the source/drain recesses 94 are disposed below the top surfaces of the STI regions 70; or the like. The source/drain recesses 94 may be formed by etching the nanostructures 64, 66 using an anisotropic etch process, such as a RIE, a NBE, or the like. The gate spacers 90 and the dummy gates 84 collectively mask portions of the fins 62 and/or the nanostructures 64, 66 during the etch processes used to form the source/drain recesses 94. A single etch process may be used to etch each of the nanostructures 64, 66, or multiple etch processes may be used to etch the nanostructures 64, 66. Timed etch processes may be used to stop the etching of the source/drain recesses 94 after the source/drain recesses 94 reach a desired depth.

Optionally, inner spacers 96 are formed on the sidewalls of the remaining portions of the first nanostructures 64, e.g., those sidewalls exposed by the source/drain recesses 94. As will be subsequently described in greater detail, source/drain regions will be subsequently formed in the source/drain recesses 94, and the first nanostructures 64 will be subsequently replaced with corresponding gate structures. The inner spacers 96 act as isolation features between the subsequently formed source/drain regions and the subsequently formed gate structures. Further, the inner spacers 96 may be used to substantially prevent damage to the subsequently formed source/drain regions by subsequent etch processes, such as etch processes used to subsequently remove the first nanostructures 64.

As an example to form the inner spacers 96, the source/drain recesses 94 can be laterally expanded. Specifically, portions of the sidewalls of the first nanostructures 64 exposed by the source/drain recesses 94 may be recessed. Although sidewalls of the first nanostructures 64 are illustrated as being straight, the sidewalls may be concave or convex. The sidewalls may be recessed by any acceptable etch process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etch process may be a wet etch using tetramethylammonium hydroxide (TMAH), ammonium hydroxide (NH$_4$OH), or the like. In another embodiment, the etch process may be a dry etch using a fluorine-based gas such as hydrogen fluoride (HF) gas. In some embodiments, the same etch process may be continually performed to both form the source/drain recesses 94 and recess the sidewalls of the first nanostructures 64. The inner spacers 96 can then be formed by conformally forming an insulating material in the source/drain recesses 94, and subsequently etching the insulating material. The insulating material may be silicon nitride or silicon oxynitride, although any suitable material, such as low-dielectric constant (low-k) materials having a k-value less than about 3.5, may be utilized. The insulating material may be formed by a deposition process, such as ALD, CVD, or the like. The etching of the insulating material may be anisotropic. For example, the etch process may be a dry etch such as a RIE, a NBE, or the like. Although outer sidewalls of the inner spacers 96 are illustrated as being flush with respect to the sidewalls of the gate spacers 90, the outer sidewalls of the inner spacers 96 may extend beyond or be recessed from the sidewalls of the gate spacers 90. In other words, the inner spacers 96 may partially fill, completely fill, or overfill the sidewall recesses. Moreover, although the sidewalls of the inner spacers 96 are illustrated as being straight, the sidewalls of the inner spacers 96 may be concave or convex.

Figure 9B:
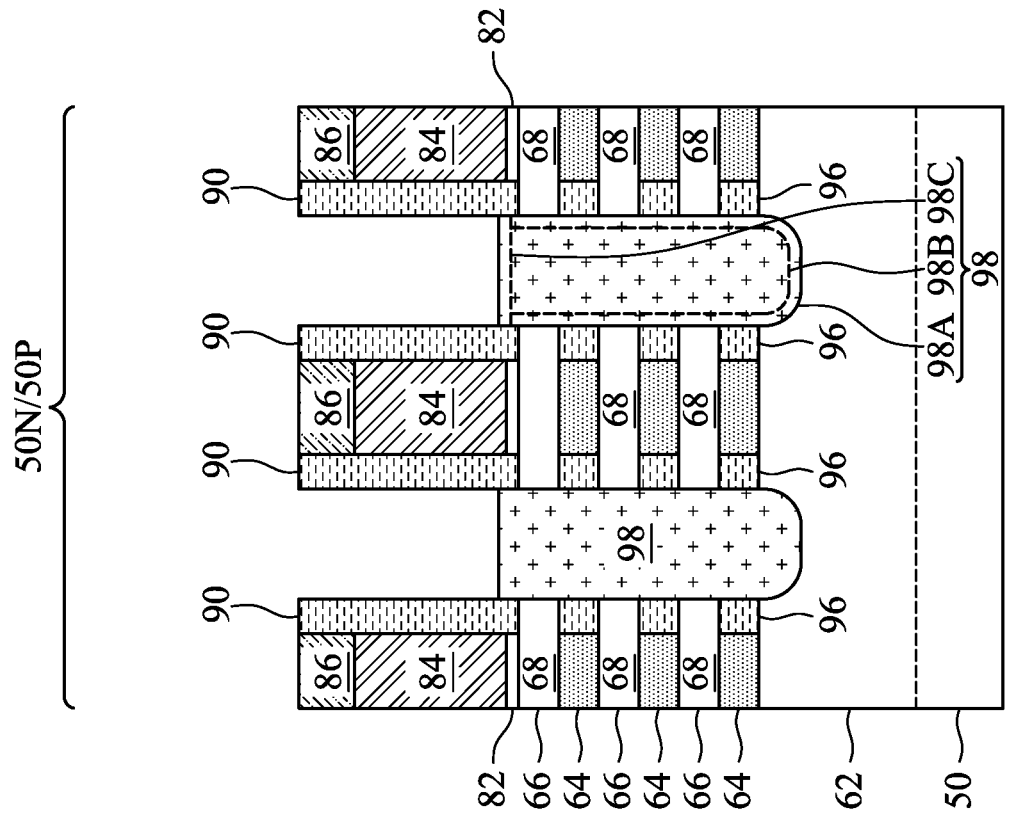
Figure 9A:
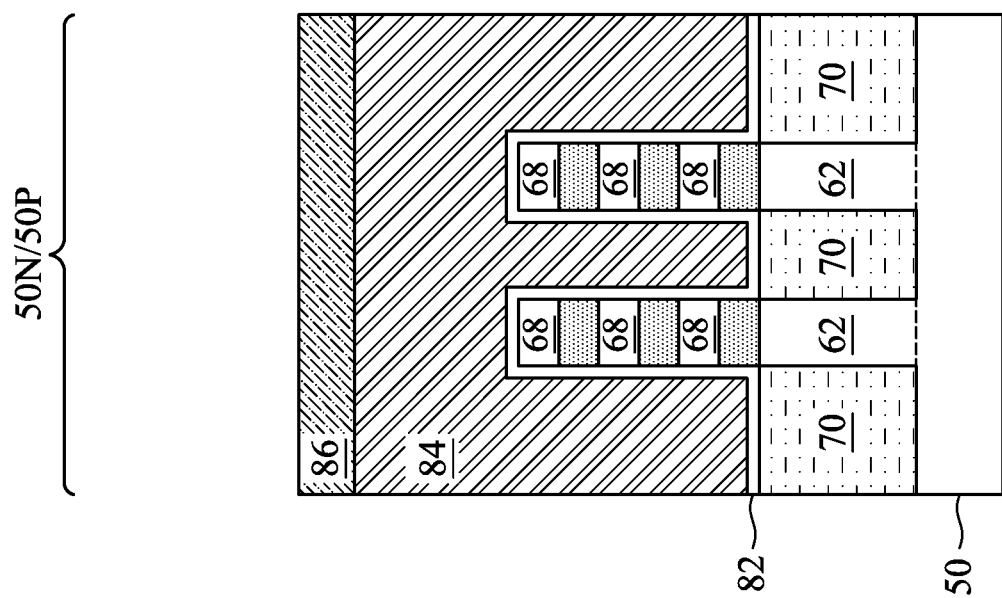
Figure 9C:
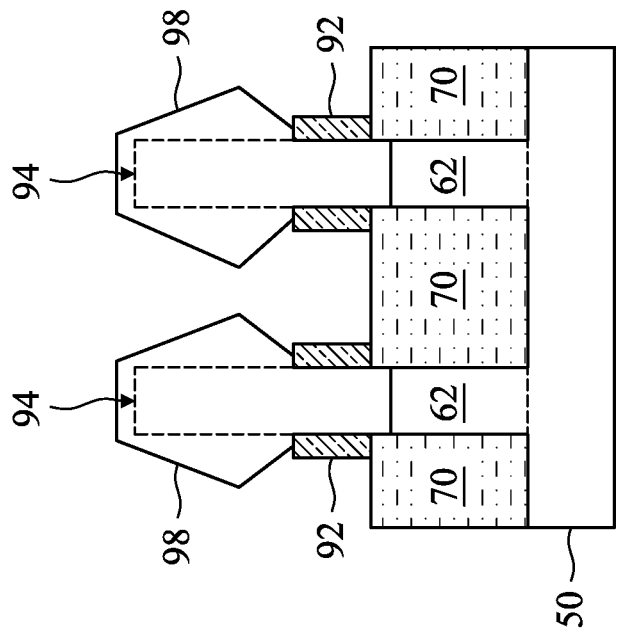
Figure 9D:
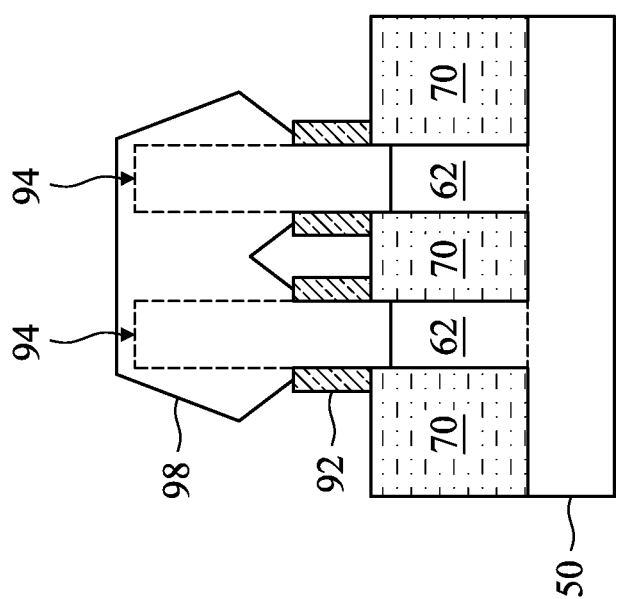

In FIGS. 9A-9B, epitaxial source/drain regions 98 are formed in the source/drain recesses 94. The epitaxial source/drain regions 98 are formed such that each dummy gate 84 (and corresponding channel region 68) is disposed between respective adjacent pairs of the epitaxial source/drain regions 98. In some embodiments, the gate spacers 90 and the inner spacers 96 are used to separate the epitaxial source/drain regions 98 from, respectively, the dummy gates 84 and the first nanostructures 64 by an appropriate lateral distance so that the epitaxial source/drain regions 98 do not short out with subsequently formed gates of the resulting nanostructure-FETs. A material of the epitaxial source/drain regions 98 may be selected to exert stress in the respective channel regions 68, thereby improving performance.

The epitaxial source/drain regions 98 in the n-type region 50N may be formed by masking the p-type region 50P. Then, the epitaxial source/drain regions 98 in the n-type region 50N are epitaxially grown in the source/drain recesses 94 in the n-type region 50N. The epitaxial source/drain regions 98 may include any acceptable material appropriate for n-type devices. For example, if the second nanostructures 66 are silicon, the epitaxial source/drain regions 98 in the n-type region 50N may include materials exerting a tensile strain on the channel regions 68, such as silicon, silicon carbide, phosphorous doped silicon carbide, silicon phosphide, or the like. The epitaxial source/drain regions 98 in the n-type region 50N may be referred to as "n-type source/drain regions." The epitaxial source/drain regions 98 in the n-type region 50N may have surfaces raised from respective surfaces of the fins 62 and the nanostructures 64, 66, and may have facets.

The epitaxial source/drain regions 98 in the p-type region 50P may be formed by masking the n-type region 50N. Then, the epitaxial source/drain regions 98 in the p-type region 50P are epitaxially grown in the source/drain recesses 94 in the p-type region 50P. The epitaxial source/drain regions 98 may include any acceptable material appropriate for p-type devices. For example, if the second nanostructures 66 are silicon, the epitaxial source/drain regions 98 in the p-type region 50P may include materials exerting a compressive strain on the channel regions 68, such as silicon germanium, boron doped silicon germanium, germanium, germanium tin, or the like. The epitaxial source/drain regions 98 in the p-type region 50P may be referred to as "p-type source/drain regions." The epitaxial source/drain regions 98 in the p-type region 50P may have surfaces raised from respective surfaces of the fins 62 and the nanostructures 64, 66, and may have facets.

The epitaxial source/drain regions 98, the nanostructures 64, 66, and/or the fins 62 may be implanted with impurities to form source/drain regions, similar to the process previously described for forming LDD regions, followed by an anneal. The source/drain regions may have an impurity concentration in the range of $10^{19}$ cm$^{-3}$ to $10^{21}$ cm$^{-3}$. The n-type and/or p-type impurities for source/drain regions may be any of the impurities previously described. In some embodiments, the epitaxial source/drain regions 98 may be in situ doped during growth.

As a result of the epitaxy processes used to form the epitaxial source/drain regions 98, upper surfaces of the epitaxial source/drain regions have facets which expand laterally outward beyond sidewalls of the fins 62 and the nanostructures 64, 66. In some embodiments, these facets cause adjacent epitaxial source/drain regions 98 to merge as illustrated by FIG. 9C. In some embodiments, adjacent epitaxial source/drain regions 98 remain separated after the epitaxy process is completed as illustrated by FIG. 9D. In the illustrated embodiments, the spacer etch used to form the gate spacers 90 is adjusted to also form fin spacers 92 on sidewalls of the fins 62 and/or the nanostructures 64, 66. The fin spacers 92 are formed to cover a portion of the sidewalls of the fins 62 and/or the nanostructures 64, 66 that extend above the STI regions 70, thereby blocking the epitaxial growth. In another embodiment, the spacer etch used to form the gate spacers 90 is adjusted to not form fin spacers, so as to allow the epitaxial source/drain regions 98 to extend to the surface of the STI regions 70.

The epitaxial source/drain regions 98 may include one or more semiconductor material layers. For example, the epitaxial source/drain regions 98 may each include a liner layer 98A, a main layer 98B, and a finishing layer 98C (or more generally, a first semiconductor material layer, a second semiconductor material layer, and a third semiconductor material layer). Any number of semiconductor material layers may be used for the epitaxial source/drain regions 98. Each of the liner layer 98A, the main layer 98B, and the finishing layer 98C may be formed of different semiconductor materials and may be doped to different impurity concentrations. In some embodiments, the liner layer 98A may have a lesser concentration of impurities than the main layer 98B, and the finishing layer 98C may have a greater concentration of impurities than the liner layer 98A and a lesser concentration of impurities than the main layer 98B. In embodiments in which the epitaxial source/drain regions 98 include three semiconductor material layers, the liner layers 98A may be grown in the source/drain recesses 94, the main layers 98B may be grown on the liner layers 98A, and the finishing layers 98C may be grown on the main layers 98B.

Figure 10B:
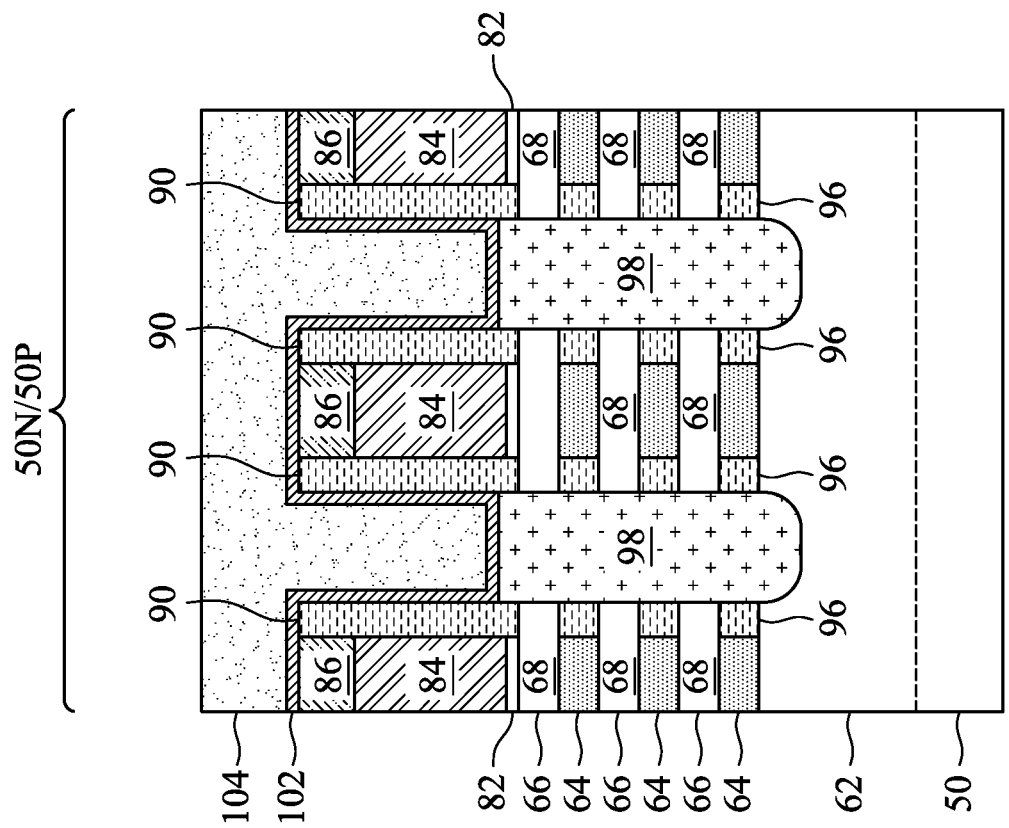
Figure 10A:
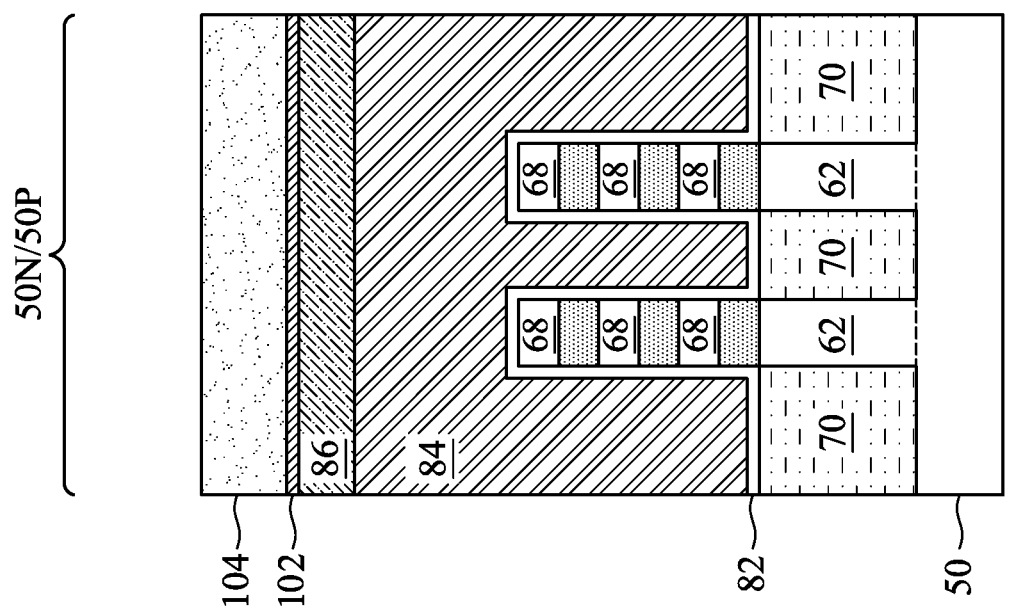

In FIGS. 10A-10B, a first ILD 104 is deposited over the epitaxial source/drain regions 98, the gate spacers 90, and the masks 86 (if present) or the dummy gates 84. The first ILD 104 may be formed of a dielectric material, which may be formed by any suitable deposition process, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 102 is formed between the first ILD 104 and the epitaxial source/drain regions 98, the gate spacers 90, and the masks 86 (if present) or the dummy gates 84. The CESL 102 may be formed of a dielectric material having a high etching selectivity from the etching of the first ILD 104, such as silicon nitride, silicon oxide, silicon oxynitride, or the like, which may be formed by any suitable deposition process, such as CVD, ALD, or the like.

Figure 11B:
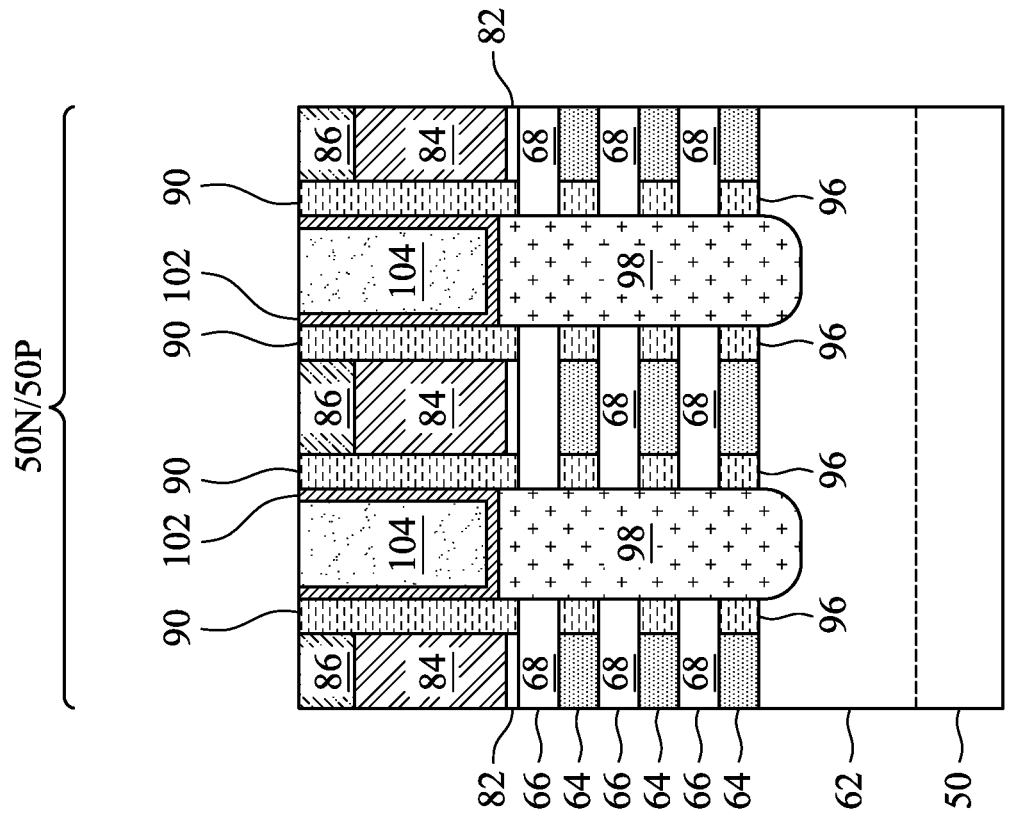
Figure 11A:
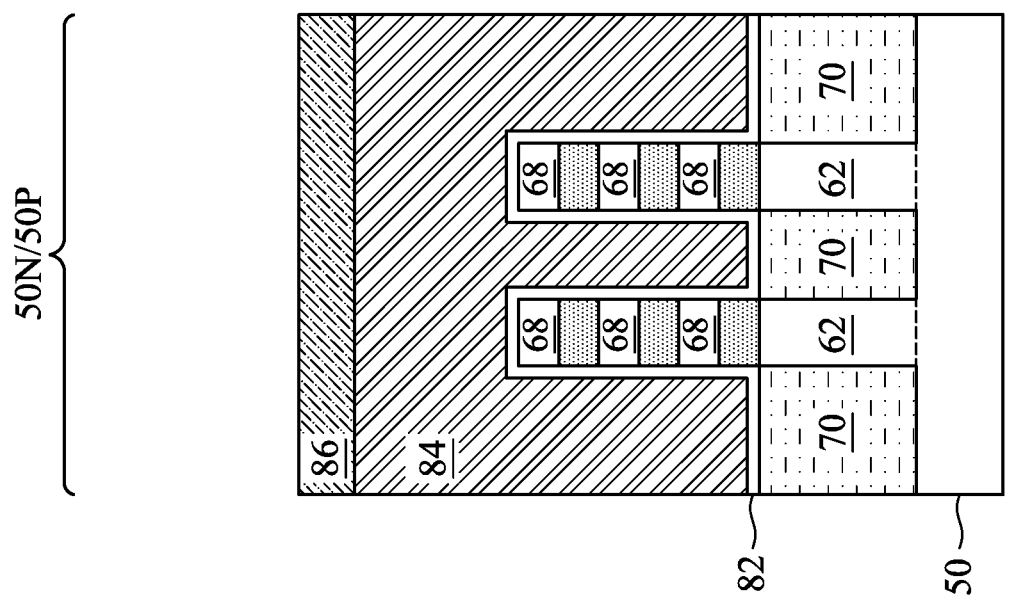

In FIGS. 11A-11B, a removal process is performed to level the top surfaces of the first ILD 104 with the top surfaces of the gate spacers 90 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 90 along sidewalls of the masks 86. After the planarization process, the top surfaces of the gate spacers 90, the first ILD 104, the CESL 102, and the masks 86 (if present) or the dummy gates 84 are coplanar (within process variations). Accordingly, the top surfaces of the masks 86 (if present) or the dummy gates 84 are exposed through the first ILD 104. In the illustrated embodiment, the masks 86 remain, and the planarization process levels the top surfaces of the first ILD 104 with the top surfaces of the masks 86.

Figure 12B:
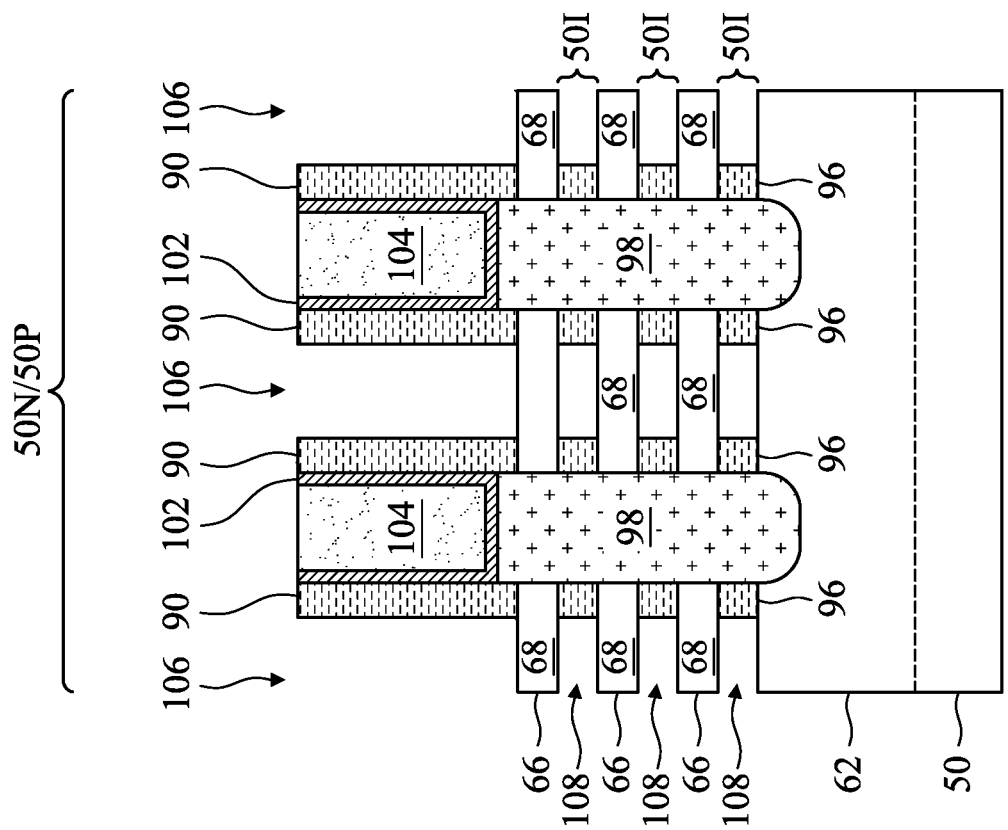
Figure 12A:
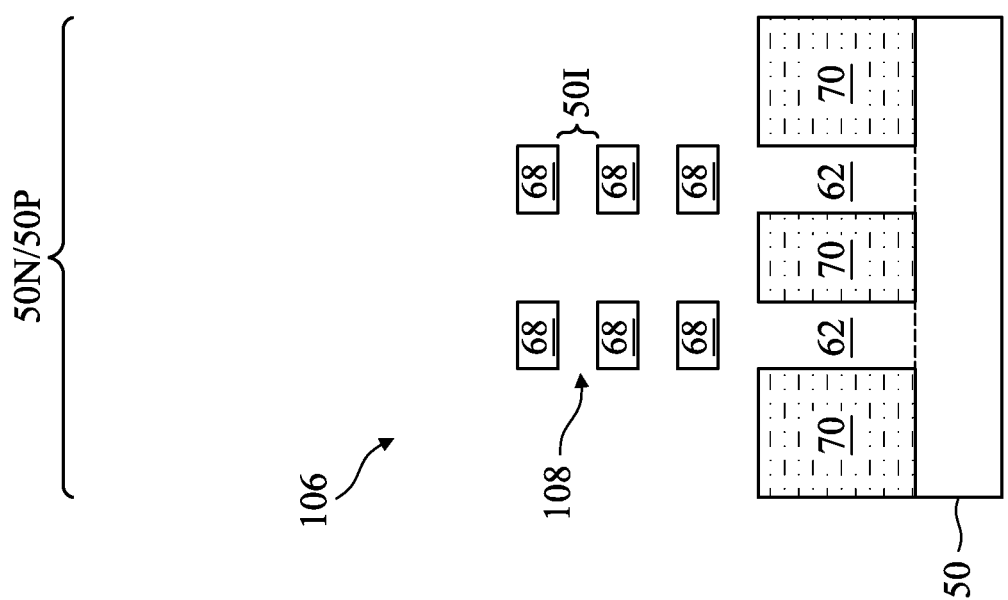

In FIGS. 12A-12B, the masks 86 (if present) and the dummy gates 84 are removed in an etch process, so that recesses 106 are formed. Portions of the dummy dielectrics 82 in the recesses 106 are also removed. In some embodiments, the dummy gates 84 are removed by an anisotropic dry etch. For example, the etch process may include a dry etch using reaction gas(es) that selectively etch the dummy gates 84 at a faster rate than the first ILD 104 or the gate spacers 90. During the removal, the dummy dielectrics 82 may be used as etch stop layers when the dummy gates 84 are etched. The dummy dielectrics 82 are then removed. Each recess 106 exposes and/or overlies portions of the channel regions 68. Portions of the second nanostructures 66 which act as the channel regions 68 are disposed between and adjoin adjacent pairs of the epitaxial source/drain regions 98.

The remaining portions of the first nanostructures 64 are then removed to form openings 108 in regions 501 between the second nanostructures 66. The remaining portions of the first nanostructures 64 can be removed by any acceptable etch process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etch process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second nanostructures 66 and expand the openings 108.

Figure 13B:
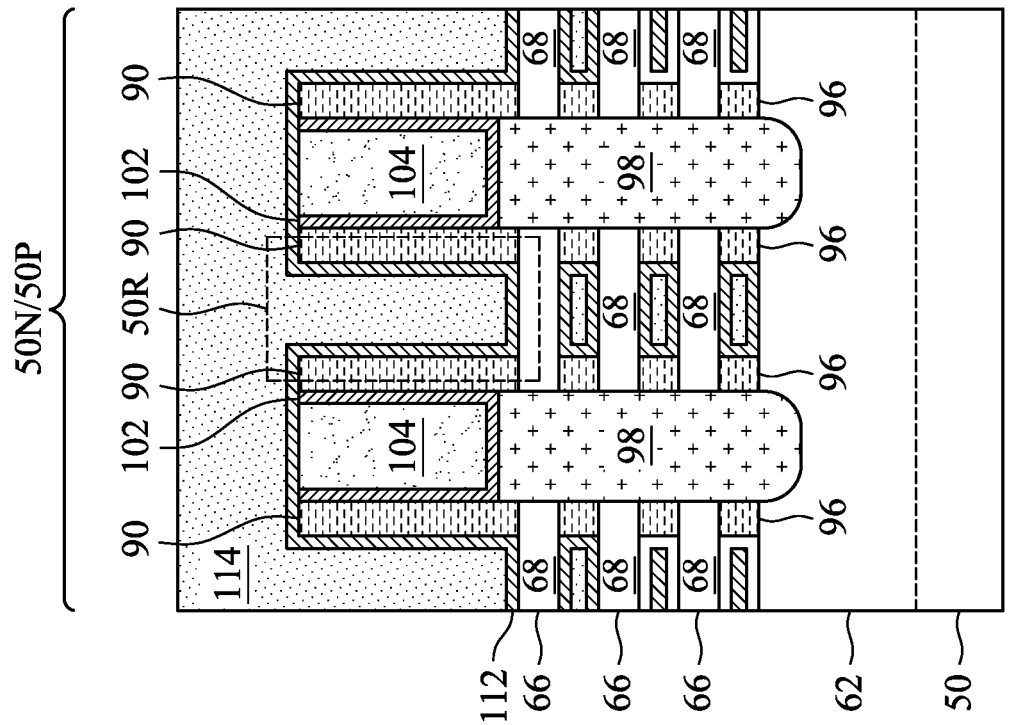
Figure 13A:
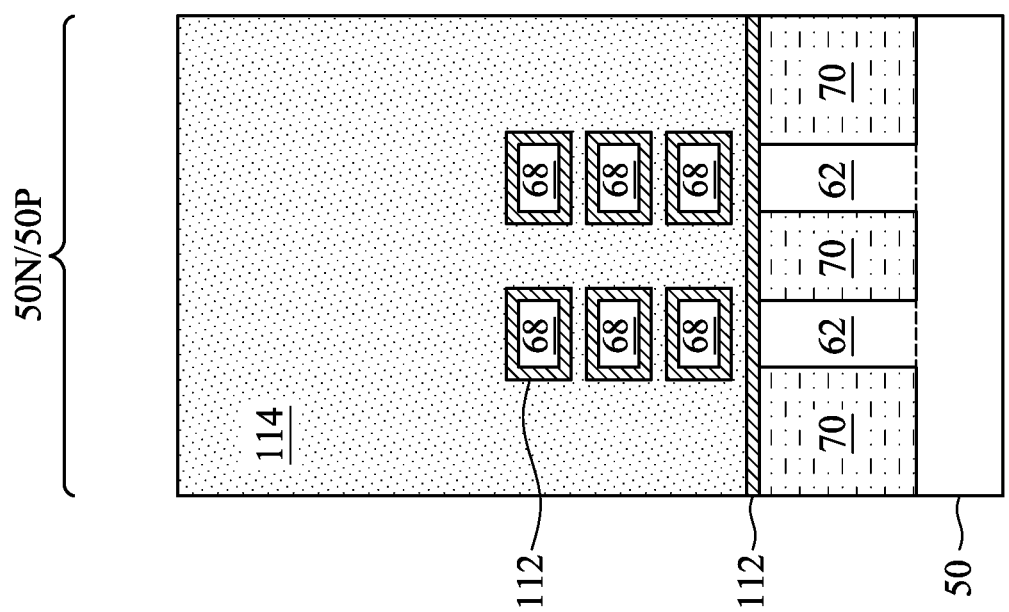
Figure 16A:
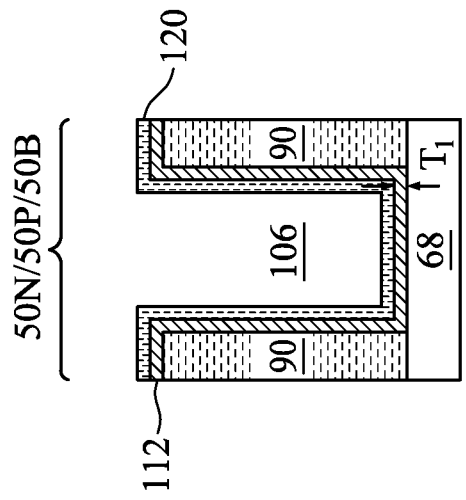
Figure 16B:
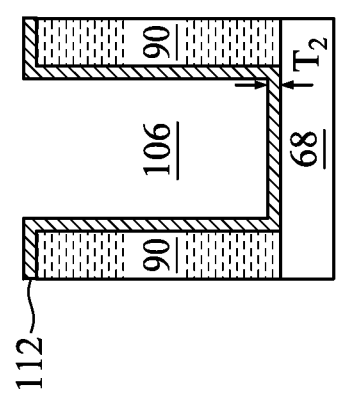
Figure 16C:
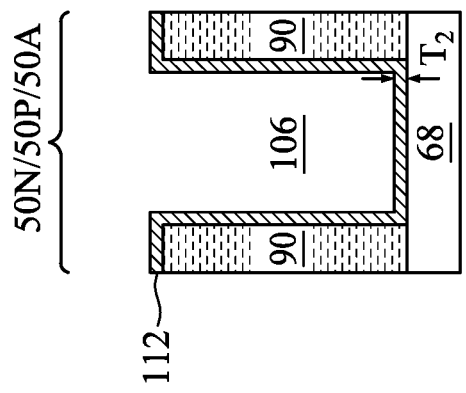
Figure 16D:
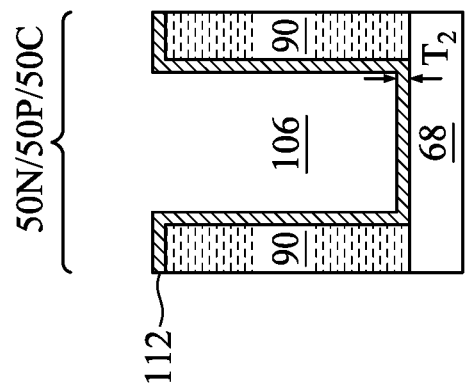
Figure 17A:
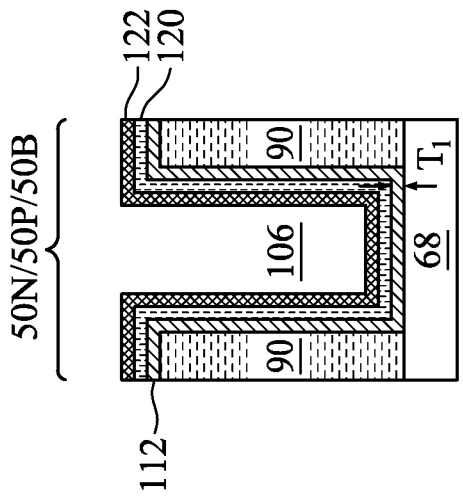
Figure 17B:
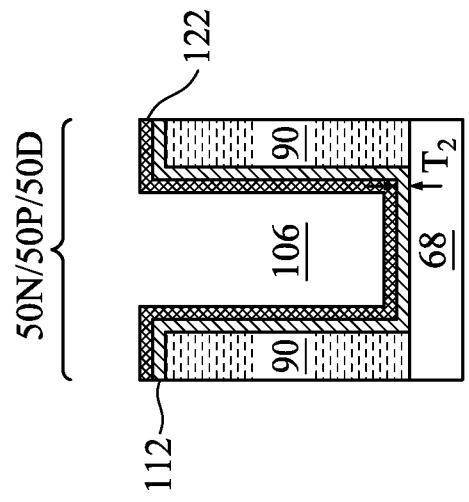
Figure 17C:
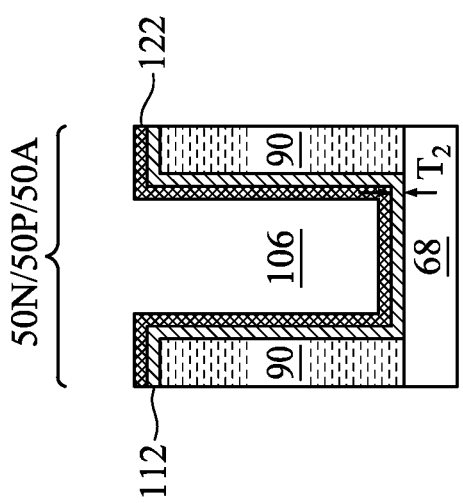
Figure 17D:
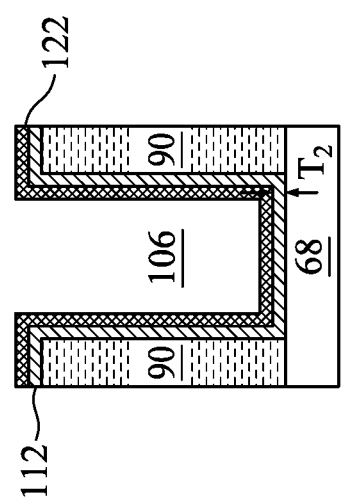
Figure 18A:
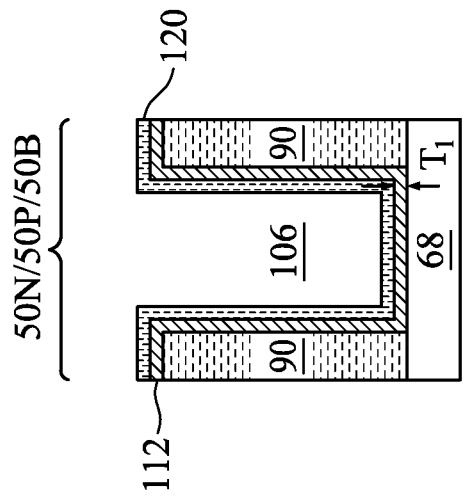
Figure 18C:
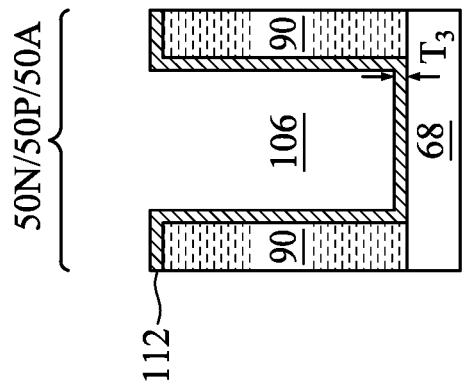
Figure 18B:
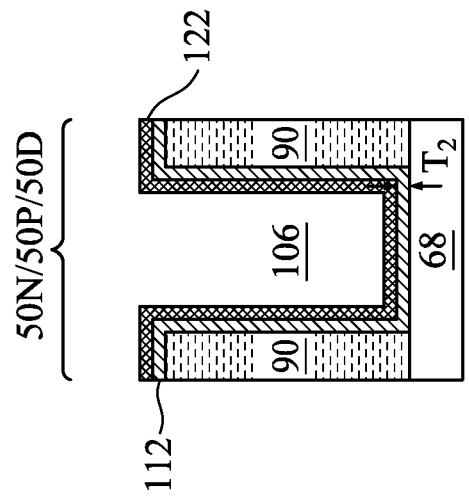
Figure 18D:
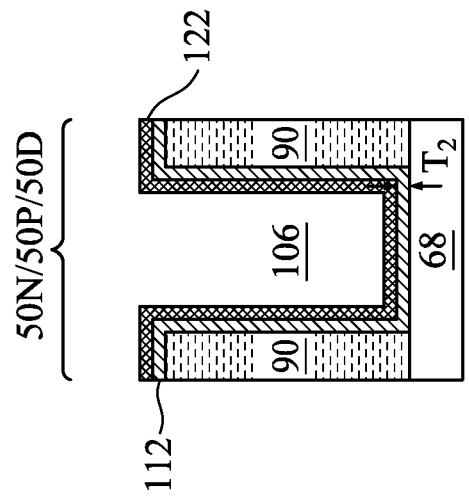
Figure 19A:
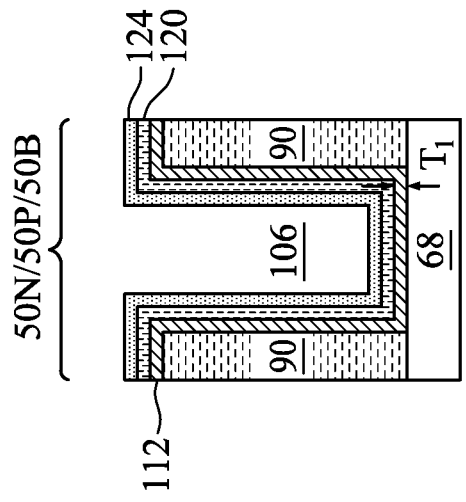
Figure 19B:
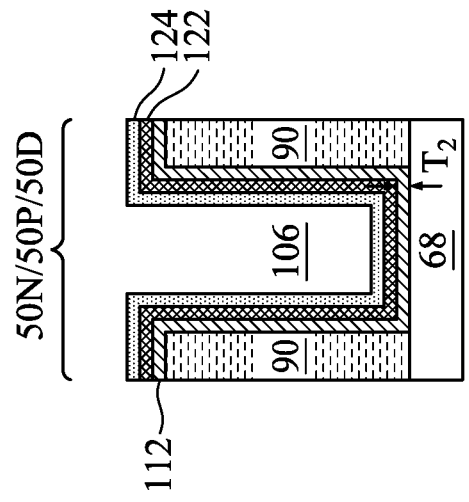
Figure 19C:
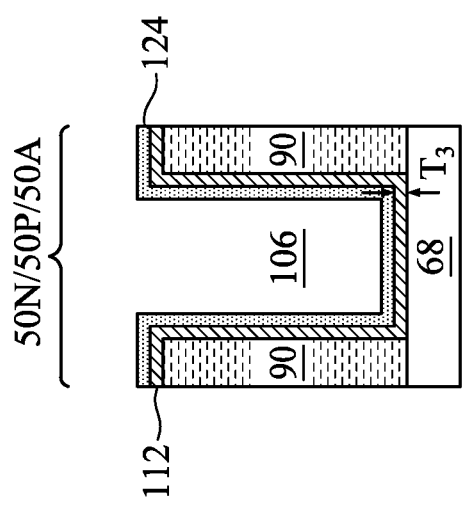
Figure 19D:
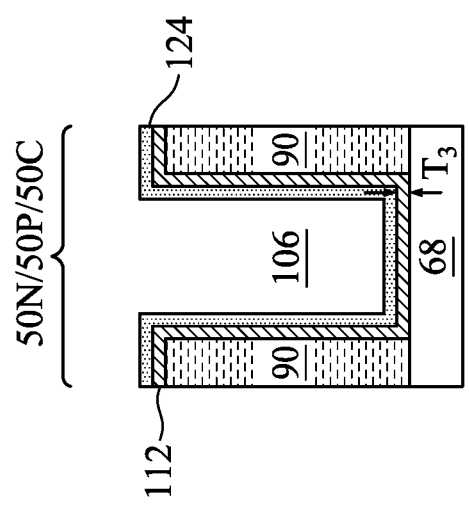
Figure 20B:
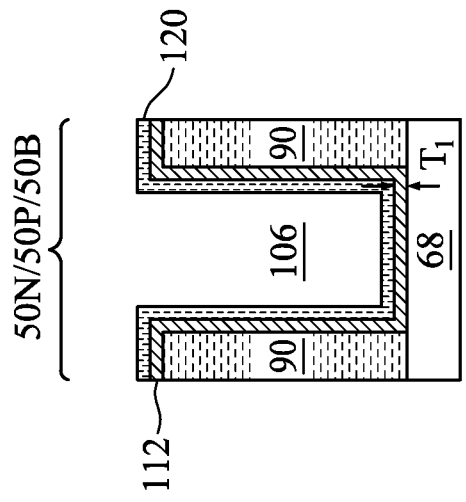
Figure 20D:
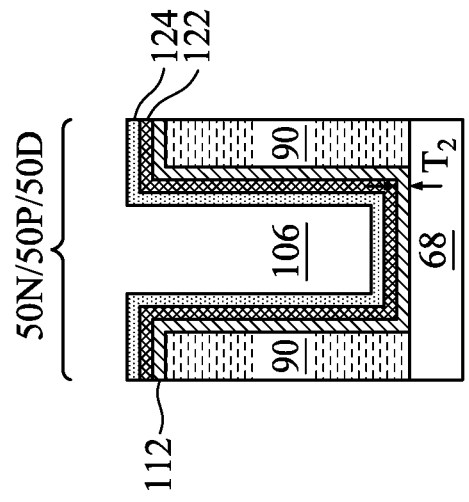
Figure 20A:
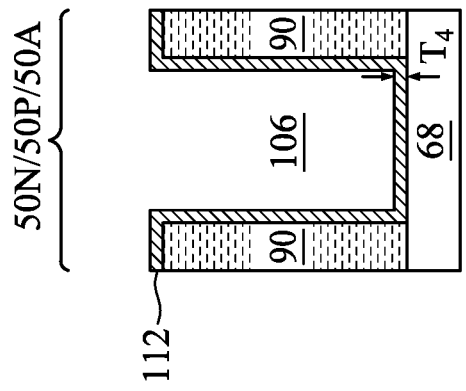
Figure 20C:
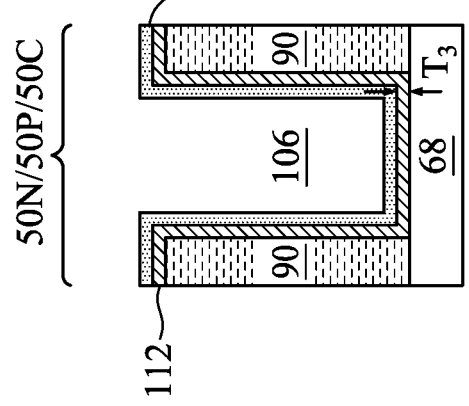
Figure 22A:
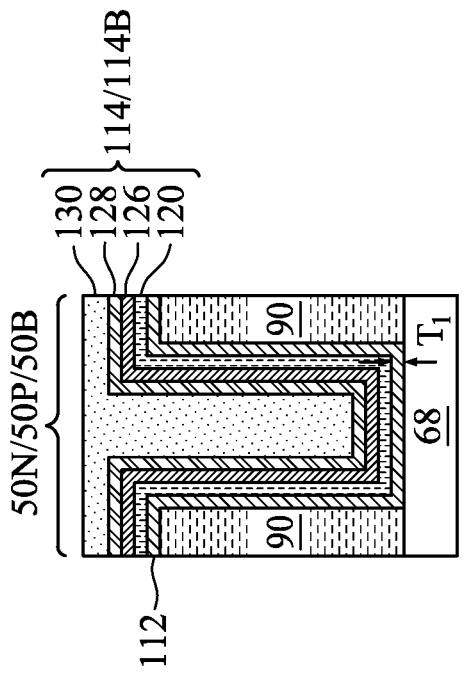
Figure 22B:
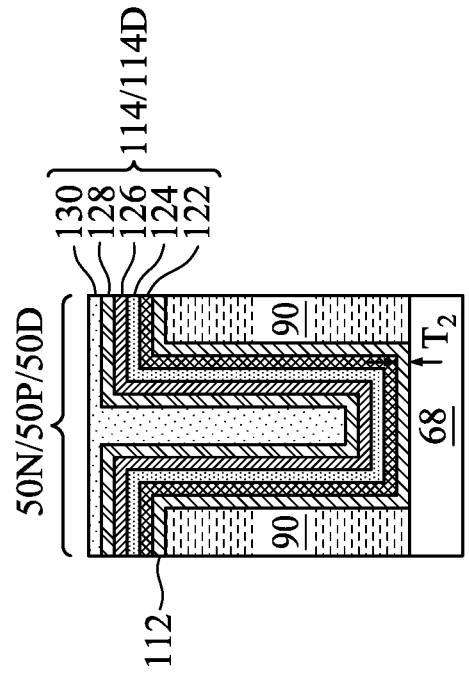
Figure 22C:
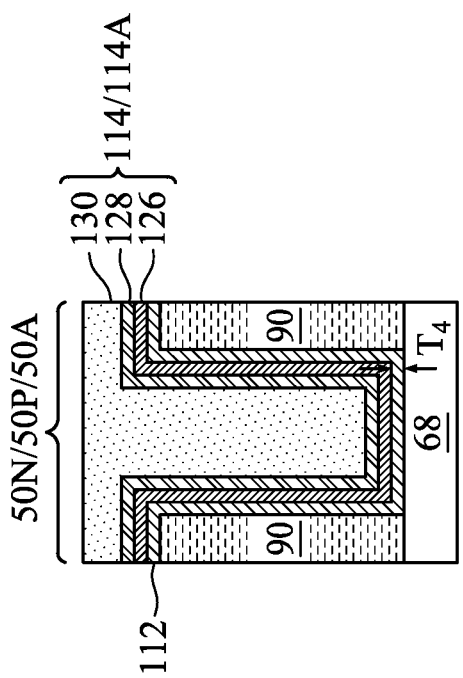
Figure 22D:
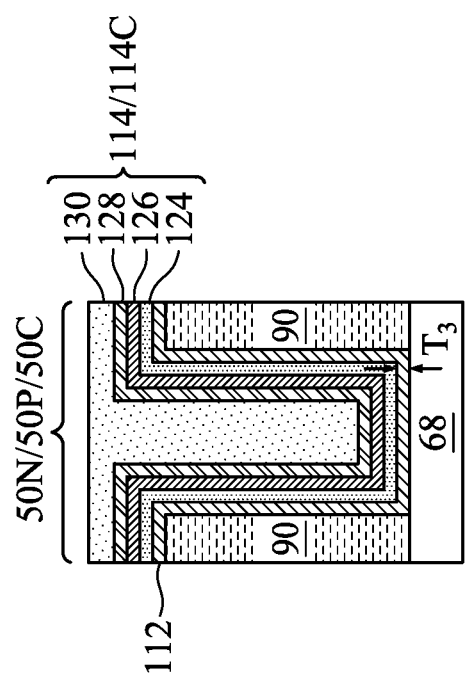

In FIGS. 13A-13B, a gate dielectric layer 112 is formed in the recesses 106 and the openings 108. A gate electrode layer 114 is formed on the gate dielectric layer 112. The gate dielectric layer 112 and the gate electrode layer 114 are layers for replacement gates, and each wrap around all (e.g., four) sides of the second nanostructures 66.

The gate dielectric layer 112 is disposed on the top surfaces of the fins 62; on the top surfaces, the sidewalls, and the bottom surfaces of the second nanostructures 66; and on the sidewalls of the gate spacers 90. The gate dielectric layer 112 may also be formed on the top surfaces of the first ILD 104 and the gate spacers 90, and may be formed on the sidewalls of the fins 62 (e.g., in embodiments where the top surfaces of the STI regions 70 are below the top surfaces of the fins 62). The gate dielectric layer 112 may include an oxide such as silicon oxide or a metal oxide, a silicate such as a metal silicate, combinations thereof, multi-layers thereof, or the like. The gate dielectric layer 112 may include a high-dielectric constant (high-k) material having a k-value greater than about 7.0, such as a metal oxide or a silicate of hafnium, aluminum, zirconium, lanthanum, manganese, barium, titanium, lead, and combinations thereof. Although a single-layered gate dielectric layer 112 is illustrated in FIGS. 13A-13B, as will be subsequently described in greater detail, the gate dielectric layer 112 may include multiple layers, such as an interfacial layer and a high-k dielectric layer. Each of the layers may be dielectric layers. Further, multiple gate dielectric layers 112 may be formed in different regions of the substrate 50.

The gate electrode layer 114 may include one or more metal-containing material(s) such as titanium nitride, titanium oxide, tantalum nitride, tantalum carbide, cobalt, ruthenium, aluminum, tungsten, combinations thereof, multi-layers thereof, or the like. Although a single-layered gate electrode layer 114 is illustrated in FIGS. 13A-13B, as will be subsequently described in greater detail, the gate electrode layer 114 may include any number of work function tuning layers, any number of glue layers, and a fill layer. Each of the layers may be metal layers. Further, multiple gate electrode layers 114 may be formed in different regions of the substrate 50.

The formation of the gate dielectric layers 112 in the n-type region 50N and the p-type region 50P may occur simultaneously such that the gate dielectric layers 112 in each region are formed of the same materials, and the formation of the gate electrode layers 114 in the n-type region 50N and the p-type region 50P may occur simultaneously such that the gate electrode layers 114 in each region are formed of the same materials. In some embodiments, the gate dielectric layers 112 in each region may be formed by distinct processes, such that the gate dielectric layers 112 may be different materials and/or have a different number of sub-layers, and/or the gate electrode layers 114 in each region may be formed by distinct processes, such that the gate electrode layers 114 may be different materials and/or have a different number of sub-layers. Various masking steps may be used to mask and expose appropriate regions when using distinct processes.

Although a single gate dielectric layer 112 and a single gate electrode layer 114 are illustrated in FIGS. 13A-13B, as will be subsequently described in greater detail, multiple gate dielectric layers 112 and/or multiple gate electrode layers 114 will be formed in different regions. FIGS. 14A-22D illustrate a process in which a gate dielectric layer 112 and gate electrode layers 114 for replacement gates are formed in the recesses 106 and the openings 108, in accordance with some embodiments. Specifically, different gate electrode layers 114 for devices with different work functions will be formed in different regions 50A, 50B, 50C, 50D. FIGS. 14A-22D are detailed views of a portion 50R of FIG. 13B, showing the different regions 50A, 50B, 50C, 50D. The gate dielectric layer 112 is used as an etch stop layer during etch process which will be used to pattern work function tuning layers for the gate electrode layers 114 in the different regions 50A, 50B, 50C, 50D. According to various embodiments, a crystallization process will be performed to decrease the etch rate of the gate dielectric layer 112 relative the etch processes used to pattern the work function tuning layers. Losses of the gate dielectric layer 112 may thus be reduced, which can reduce the leakage current of the resulting devices, thereby improving device performance.

In FIGS. 14A-14D, the gate dielectric layer 112 is conformally formed on the channel regions 68 in the regions 50A, 50B, 50C, 50D, such that it conformally lines the recesses 106 and the openings 108 (see FIGS. 12A-12B). The gate dielectric layer 112 may also be formed on the top surfaces of the gate spacers 90 and the first ILD 104 (see FIG. 13B). The formation methods of the gate dielectric layer 112 may include deposition methods such as molecular-beam deposition (MBD), ALD, PECVD, and the like. The gate dielectric layer 112 wraps around all (e.g., four) sides of the second nanostructures 66. In some embodiments, the gate dielectric layer 112 is multi-layered, including an interfacial layer and an overlying high-k dielectric layer. The interfacial layer may be formed of silicon oxide and the high-k dielectric layer may be formed of hafnium oxide. The gate dielectric layer 112 may include any acceptable number of sub-layers. In some embodiments, the gate dielectric layer 112 has a thickness in the range of 10 Å to 13 Å when it is initially formed.

In this embodiment, the gate dielectric layer 112 is a same continuous dielectric layer which is deposited in the recesses 106 and the openings 108 (see FIGS. 12A-12B) in each of the regions 50A, 50B, 50C, 50D. Thus, the gate dielectric layer 112 is formed of the same material in each of the regions 50A, 50B, 50C, 50D. In another embodiment (subsequently described for FIGS. 29A-30D), different gate dielectric layers 112 are formed in the regions 50A, 50B, 50C, 50D by distinct processes, such that the gate dielectric layers 112 include different materials and/or have a different number of sub-layers.

Figure 27:
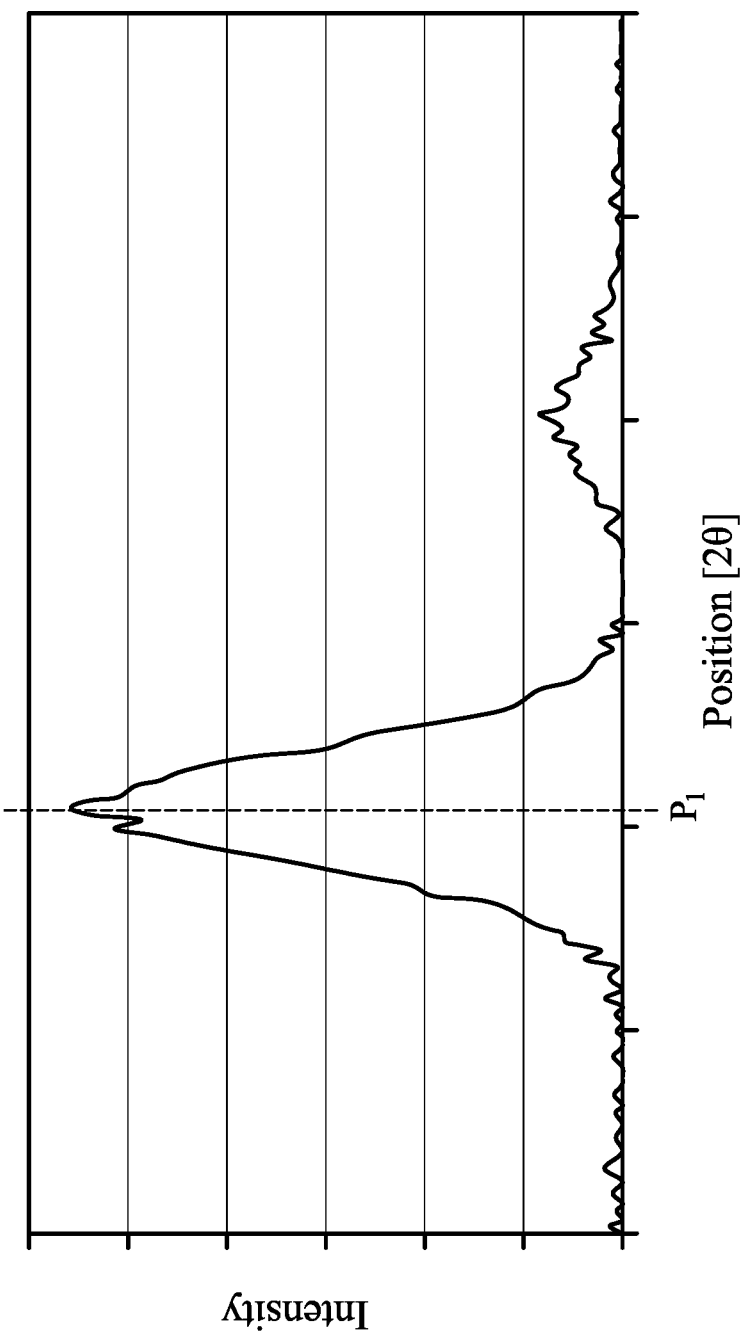
FIG. 27 is a diffraction pattern of an example gate dielectric layer.
Figure 28A:
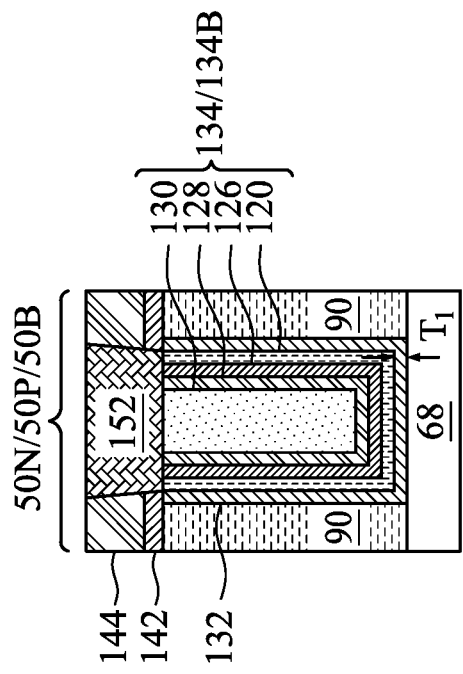
FIGS. 28A-28D are views of devices, in accordance with some embodiments.
Figure 28B:
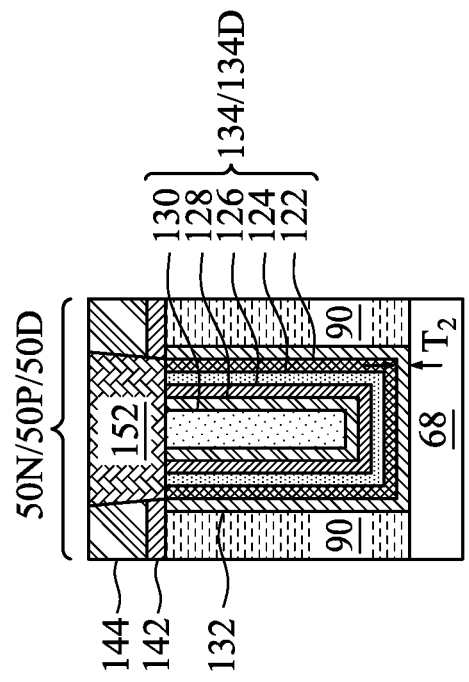
Figure 28C:
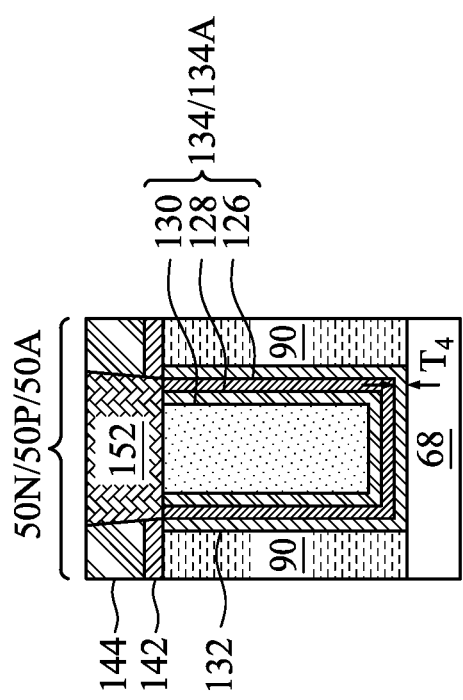
Figure 28D:
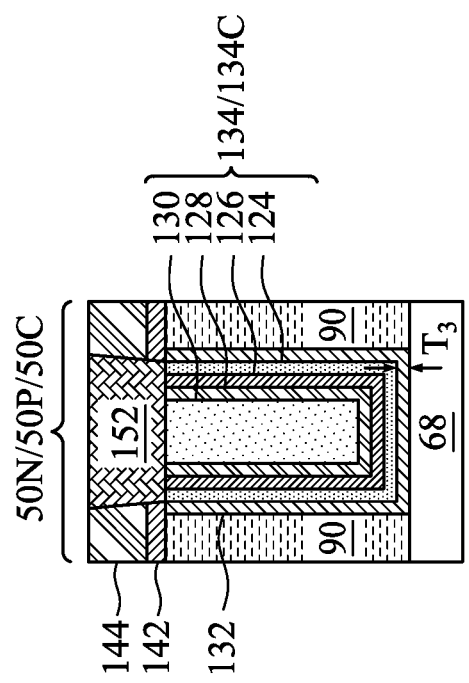
Figure 29A:
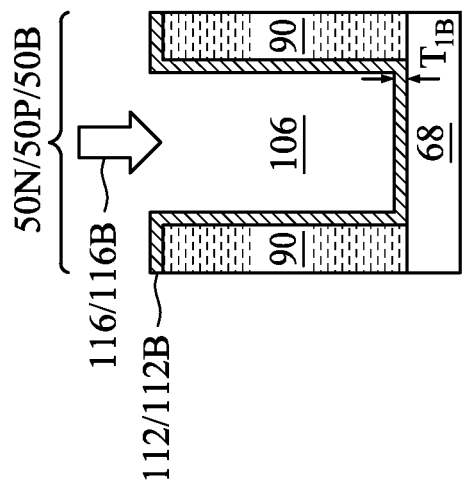
FIGS. 29A-30D are views of intermediate stages in the manufacturing of devices, in accordance with some embodiments.
Figure 29B:
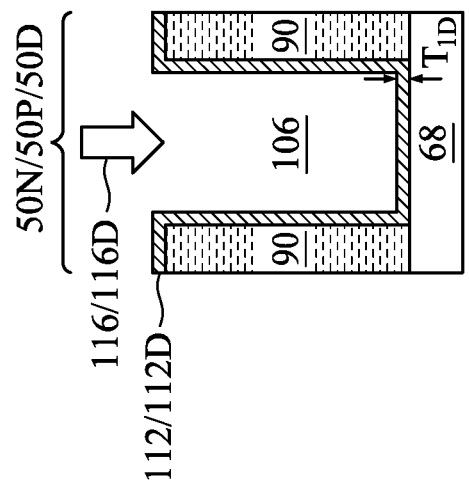
Figure 29C:
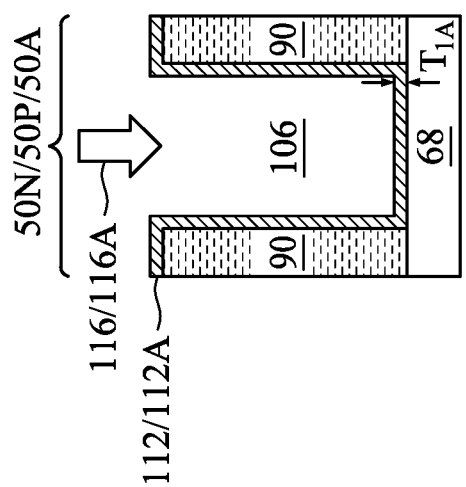
Figure 29D:
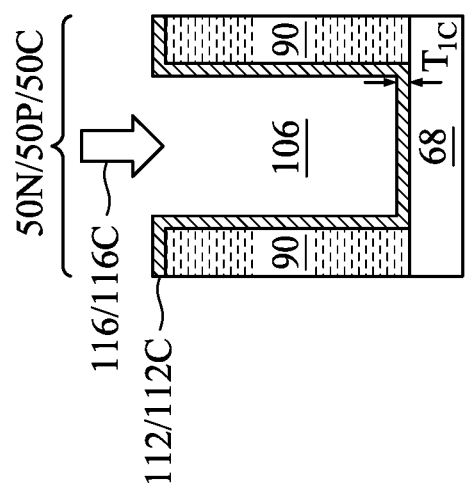
Figure 30A:
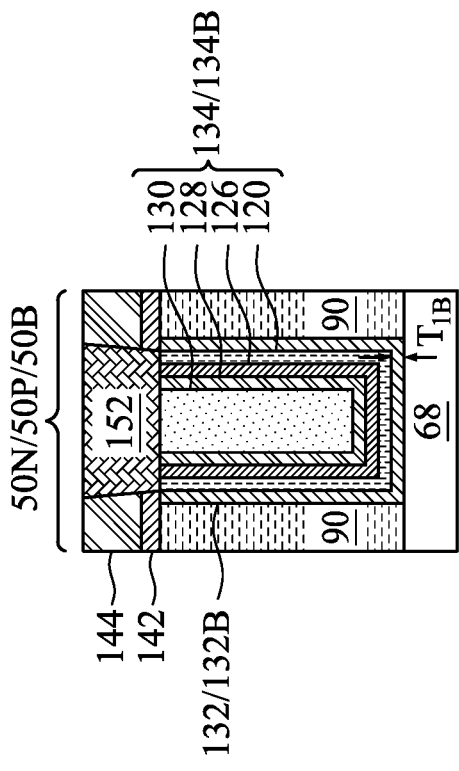
Figure 30B:
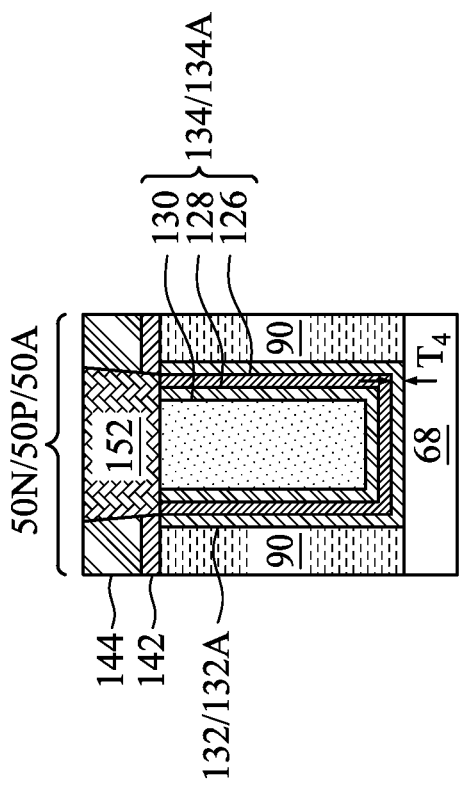
Figure 30C:
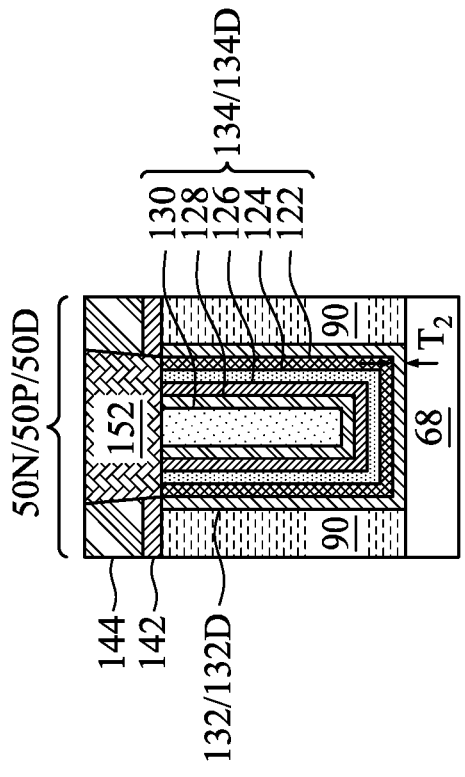
Figure 30D:
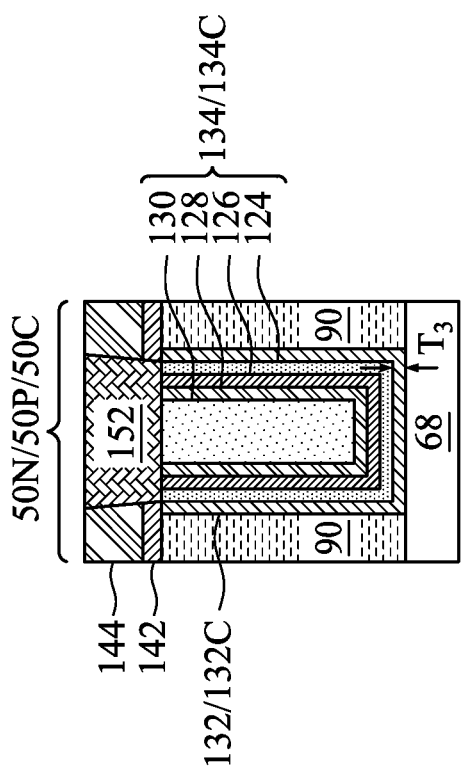

After the gate dielectric layer 112 is formed, it is treated by a crystallization process 116 to decrease the etch rate of the gate dielectric layer 112 relative etch processes that will be used to pattern subsequently formed work function tuning layers that overly the gate dielectric layer 112. The crystallization process 116 crystallizes the gate dielectric layer 112, such that crystallinity of the material(s) of the gate dielectric layer 112 is increased. For example, the gate dielectric layer 112 may be an amorphous high-k dielectric layer when it is initially deposited, and the crystallization process 116 may at least partially crystallize the amorphous high-k dielectric layer to form a crystalline high-k dielectric layer. FIG. 27 is a diffraction pattern of an example gate dielectric layer after a crystallization process 116, in accordance with some embodiments. At a position $P_1$, the amorphous high-k dielectric layer may have a crystallinity in the range of 5% to 30% before the crystallization process 116, and the crystalline high-k dielectric layer may have a crystallinity in the range of 60% to 100% after the crystallization process 116. In some embodiments, the crystallization process 116 includes annealing the gate dielectric layer 112 with an anneal process. Based on the material(s) of the amorphous high-k dielectric layer, the process conditions (e.g., temperature, pressure, duration, and/or ambient environment) of the anneal process may be controlled so that the amorphous high-k dielectric layer is crystallized to have a desired crystalline structure (e.g., a desired crystalline phase, a desired crystalline orientation, and/or a desired crystalline grain size). Accordingly, a desired set of physical properties of the amorphous high-k dielectric layer can be modified so that the crystalline high-k dielectric layer has a desired etching selectivity (subsequently described) from the etching of the subsequently formed work function tuning layers. In some embodiments, the amorphous high-k dielectric layer is crystallized to have a cubic, tetragonal, or orthorhombic crystalline phase. In some embodiments, the amorphous high-k dielectric layer is crystallized to have a <111>, <202>, <220>, <311>, or <222> crystalline orientation when the amorphous high-k dielectric layer has a tetragonal crystalline phase. In some embodiments, the amorphous high-k dielectric layer is crystallized to have a <211> crystalline orientation when the amorphous high-k dielectric layer has an orthorhombic crystalline phase. In some embodiments, the amorphous high-k dielectric layer is crystallized to have a crystalline grain size in the range of 3 nm to 25 nm. A crystalline high-k dielectric layer with such a crystalline structure may have an increased etching selectivity from the etching of the subsequently formed work function tuning layers, as compared to an amorphous high-k dielectric layer.

In some embodiments, the crystallization process 116 includes annealing the gate dielectric layer 112 with an anneal process which has a brief duration, such as a duration on the order of milliseconds. Such a brief anneal process may be referred to as a "microsecond anneal process." In some embodiments, the microsecond anneal process is performed by annealing the gate dielectric layer 112 at a temperature in the range of 1000° C. to 1150° C., for a duration in the range of 1.2 milliseconds to 12 milliseconds, at a pressure in the range of 3 Torr to 760 Torr, and in an ambient environment containing nitrogen ($N_2$) and/or argon (Ar). Performing the microsecond anneal process with process conditions in these ranges crystallizes the material(s) of the gate dielectric layer 112 to have a set of physical properties which results in a desired etching selectivity (subsequently described) from the etching of the subsequently formed work function tuning layers. Performing the microsecond anneal process at a temperature of less than 1000° C. or for a duration of less than 1.2 milliseconds may not sufficiently crystalize the material(s) of the gate dielectric layer 112. Performing the microsecond anneal process at a temperature of greater than 1150° C. or for a duration of greater than 12 milliseconds may cause short-channel effects, such as drain-induced barrier lowering (DIBL), in the resulting devices.

The crystallization process 116 increases the thickness of the gate dielectric layer 112. In some embodiments, the crystallization process 116 increases the thickness of the gate dielectric layer 112 by 5% to 15%. In some embodiments, the gate dielectric layer 112 has a thickness $T_1$ in the range of 12.0 Å to 14 Å after the crystallization process 116.

In FIGS. 15A-15D, a first work function tuning layer 120 is conformally formed on the gate dielectric layer 112. The first work function tuning layer 120 is formed of a work function material that is acceptable to tune a work function of a nanostructure-FET to a desired amount given the application of the device to be formed, and may be formed by any acceptable deposition process. In some embodiments, the first work function tuning layer 120 is formed of titanium aluminide, titanium aluminium nitride, titanium aluminium carbide, or the like, which may be formed by PVD, ALD, CVD, or the like.

In FIGS. 16A-16D, the first work function tuning layer 120 is patterned to remove portions of the first work function tuning layer 120 in some regions. In this embodiment, the portions of the first work function tuning layer 120 in the regions 50A, 50C, 50D are removed, so that the first work function tuning layer 120 remains in the region 50B. The first work function tuning layer 120 may be patterned by any acceptable etch process, using an etching mask (not separately illustrated) such as a photoresist. For example, a photoresist may be formed over the first work function tuning layer 120 and patterned to expose portions of the first work function tuning layer 120. The photoresist can be formed by using a spin-on technique and can be patterned using acceptable photolithography techniques. Once the photoresist is patterned, the etch process is performed using the photoresist as an etching mask to remove the exposed portions of the first work function tuning layer 120. The etch process is selective to the first work function tuning layer 120 (e.g., selectively etches the material of the first work function tuning layer 120 at a faster rate than the material(s) of the gate dielectric layer 112). The etch process may be isotropic. In some embodiments, the first work function tuning layer 120 is etched by a wet etch using SC-1 (a mixture of ammonium hydroxide, hydrogen peroxide, and water), SC-2 (a mixture of deionized water, hydrochloric acid, and hydrogen peroxide), or hydrogen peroxide as etchants. The gate dielectric layer 112 is used as an etch stop layer during the etch process, such that the gate dielectric layer 112 is exposed to the etchant(s) at the end of the etch process. After the etch process, the photoresist may be removed, such as by any acceptable ashing process.

As noted above, the gate dielectric layer 112 is used as an etch stop layer during the etch process used to pattern the first work function tuning layer 120. Although the etch process is selective to the first work function tuning layer 120, some etching of the gate dielectric layer 112 still occurs. The etching of the gate dielectric layer 112 thins the portions of the gate dielectric layer 112 in the regions where the gate dielectric layer 112 is used as an etch stop layer. In this embodiment, the portions of the gate dielectric layer 112 in the regions 50A, 50C, 50D are thinned. In some embodiments, the thinned portions of the gate dielectric layer 112 have a thickness $T_2$ in the range of 11 Å to 14 Å.

In FIGS. 17A-17D, a second work function tuning layer 122 is conformally formed on the first work function tuning layer 120 and the gate dielectric layer 112. The second work function tuning layer 122 is formed of a work function material that is acceptable to tune a work function of a nanostructure-FET to a desired amount given the application of the device to be formed, and may be formed by any acceptable deposition process. In some embodiments, the second work function tuning layer 122 is formed of titanium nitride, tungsten, or the like, which may be formed by PVD, ALD, CVD, or the like. The second work function tuning layer 122 may be formed of a different work function material than the first work function tuning layer 120.

In FIGS. 18A-18D, the second work function tuning layer 122 is patterned to remove portions of the second work function tuning layer 122 in some regions. In this embodiment, the portions of the second work function tuning layer 122 in the regions 50A, 50B, 50C are removed, so that the second work function tuning layer 122 remains in the region 50D. The second work function tuning layer 122 may be patterned by any acceptable etch process, using an etching mask (not separately illustrated) such as a photoresist. For example, a photoresist may be formed over the second work function tuning layer 122 and patterned to expose portions of the second work function tuning layer 122. The photoresist can be formed by using a spin-on technique and can be patterned using acceptable photolithography techniques. Once the photoresist is patterned, the etch process is performed using the photoresist as an etching mask to remove the exposed portions of the second work function tuning layer 122. The etch process is selective to the second work function tuning layer 122 (e.g., selectively etches the material of the second work function tuning layer 122 at a faster rate than the materials of the gate dielectric layer 112 and the first work function tuning layer 120). The etch process may be isotropic. In some embodiments, the second work function tuning layer 122 is etched by a wet etch using SC-1 (a mixture of ammonium hydroxide, hydrogen peroxide, and water), SC-2 (a mixture of deionized water, hydrochloric acid, and hydrogen peroxide), or hydrogen peroxide as etchants. The gate dielectric layer 112 and the first work function tuning layer 120 are used as etch stop layers during the etch process, such that those layer(s) are exposed to the etchant(s) at the end of the etch process. After the etch process, the photoresist may be removed, such as by any acceptable ashing process.

As noted above, the gate dielectric layer 112 and the first work function tuning layer 120 are used as etch stop layers during the etch process used to pattern the second work function tuning layer 122. Specifically, the gate dielectric layer 112 is used as an etch stop layer in the regions where the gate dielectric layer 112 directly underlies the second work function tuning layer 122, and the first work function tuning layer 120 is used as an etch stop layer in the regions where the first work function tuning layer 120 directly underlies the second work function tuning layer 122. Although the etch process is selective to the second work function tuning layer 122, some etching of the gate dielectric layer 112 and the first work function tuning layer 120 still occurs. The etching of the first work function tuning layer 120 thins the portions of the first work function tuning layer 120 in the regions where the first work function tuning layer 120 is used as an etch stop layer. The etching of the gate dielectric layer 112 further thins the portions of the gate dielectric layer 112 in the regions where the gate dielectric layer 112 is used as an etch stop layer. In this embodiment, the portions of the first work function tuning layer 120 in the region 50B are thinned, and the portions of the gate dielectric layer 112 in the regions 50A, 50C are further thinned. In some embodiments, the further thinned portions of the gate dielectric layer 112 have a thickness $T_3$ in the range of 11 Å to 14 Å.

In FIGS. 19A-19D, a third work function tuning layer 124 is conformally formed on the second work function tuning layer 122, the first work function tuning layer 120, and the gate dielectric layer 112. The third work function tuning layer 124 is formed of a work function material that is acceptable to tune a work function of a nanostructure-FET to a desired amount given the application of the device to be formed, and may be formed by any acceptable deposition process. In some embodiments, the third work function tuning layer 124 is formed of titanium nitride, tungsten, tantalum nitride, or the like, which may be formed by PVD, ALD, CVD, or the like. The third work function tuning layer 124 may be formed of a different work function material than the first work function tuning layer 120 and the second work function tuning layer 122.

In FIGS. 20A-20D, the third work function tuning layer 124 is patterned to remove portions of the third work function tuning layer 124 in some regions. In this embodiment, the portions of the third work function tuning layer 124 in the regions 50A, 50B are removed, so that the third work function tuning layer 124 remains in the regions 50C, 50D. The third work function tuning layer 124 may be patterned by any acceptable etch process, using an etching mask (not separately illustrated) such as a photoresist. For example, a photoresist may be formed over the third work function tuning layer 124 and patterned to expose portions of the third work function tuning layer 124. The photoresist can be formed by using a spin-on technique and can be patterned using acceptable photolithography techniques. Once the photoresist is patterned, the etch process is performed using the photoresist as an etching mask to remove the exposed portions of the third work function tuning layer 124. The etch process is selective to the third work function tuning layer 124 (e.g., selectively etches the material of the third work function tuning layer 124 at a faster rate than the materials of the gate dielectric layer 112, the first work function tuning layer 120, and the second work function tuning layer 122). The etch process may be isotropic. In some embodiments, the third work function tuning layer 124 is etched by a wet etch using SC-1 (a mixture of ammonium hydroxide, hydrogen peroxide, and water), SC-2 (a mixture of deionized water, hydrochloric acid, and hydrogen peroxide), or hydrogen peroxide as etchants. The gate dielectric layer 112, the first work function tuning layer 120, and the second work function tuning layer 122 are used as etch stop layers during the etch process, such that those layer(s) are exposed to the etchant(s) at the end of the etch process. After the etch process, the photoresist may be removed, such as by any acceptable ashing process.

As noted above, the gate dielectric layer 112, the first work function tuning layer 120, and the second work function tuning layer 122 are used as etch stop layers during the etch process used to pattern the third work function tuning layer 124. Specifically, the gate dielectric layer 112 is used as an etch stop layer in the regions where the gate dielectric layer 112 directly underlies the third work function tuning layer 124, the first work function tuning layer 120 is used as an etch stop layer in the regions where the first work function tuning layer 120 directly underlies the third work function tuning layer 124, and the second work function tuning layer 122 is used as an etch stop layer in the regions where the second work function tuning layer 122 directly underlies the third work function tuning layer 124. Although the etch process is selective to the third work function tuning layer 124, some etching of the gate dielectric layer 112, the first work function tuning layer 120, and the second work function tuning layer 122 still occurs. The etching of the second work function tuning layer 122 thins the portions of the second work function tuning layer 122 in the regions where the second work function tuning layer 122 is used as an etch stop layer. The etching of the first work function tuning layer 120 thins the portions of the first work function tuning layer 120 in the regions where the first work function tuning layer 120 is used as an etch stop layer. The etching of the gate dielectric layer 112 further thins the portions of the gate dielectric layer 112 in the regions where the gate dielectric layer 112 is used as an etch stop layer. In this embodiment, no portions of the second work function tuning layer 122 are thinned, the portions of the first work function tuning layer 120 in the region 50B are thinned, and the portions of the gate dielectric layer 112 in the region 50A are further thinned. In some embodiments, the further thinned portions of the gate dielectric layer 112 have a thickness $T_4$ in the range of 11 Å to 14 Å.

In FIGS. 21A-21D, a fourth work function tuning layer 126 is conformally formed on the third work function tuning layer 124, the second work function tuning layer 122, the first work function tuning layer 120, and the gate dielectric layer 112. The fourth work function tuning layer 126 is formed of a work function material that is acceptable to tune a work function of a nanostructure-FET to a desired amount given the application of the device to be formed, and may be formed by any acceptable deposition process. In some embodiments, the fourth work function tuning layer 126 is formed of titanium nitride, tungsten, or the like, which may be formed by PVD, ALD, CVD, or the like. The fourth work function tuning layer 126 may be formed of a different work function material than the first work function tuning layer 120, the second work function tuning layer 122, and the third work function tuning layer 124.

In FIGS. 22A-22D, the remaining portions of the gate electrode layer 114 are formed. In the illustrated embodiment, a glue layer 128 is deposited on the fourth work function tuning layer 126, and a fill layer 130 is deposited on the glue layer 128. After formation is complete, the gate electrode layer 114 in each region includes the fill layer 130, the glue layer 128, and one or more of the work function tuning layers 120, 122, 124, 126. In the illustrated embodiment, the gate electrode layer 114A in the region 50A includes the fill layer 130, the glue layer 128, and the work function tuning layer 126; the gate electrode layer 114B in the region 50B includes the fill layer 130, the glue layer 128, and the work function tuning layers 120, 126; the gate electrode layer 114C in the region 50C includes the fill layer 130, the glue layer 128, and the work function tuning layers 124, 126; and the gate electrode layer 114D in the region 50D includes the fill layer 130, the glue layer 128, and the work function tuning layers 122, 124, 126.

The glue layer 128 may be conformally formed on the fourth work function tuning layer 126. The glue layer 128 may be formed of a conductive material such as titanium nitride, tantalum nitride, titanium carbide, tantalum carbide, or the like, which may be formed by a deposition process such as CVD, ALD, PECVD, PVD, or the like. The glue layer 128 may alternately be referred to as an adhesion layer and improves adhesion between the fourth work function tuning layer 126 and the fill layer 130.

The fill layer 130 may be conformally formed on the glue layer 128. In some embodiments, the fill layer 130 may be formed of a conductive material such as cobalt, ruthenium, aluminum, tungsten, combinations thereof, or the like, which may be formed by a deposition process such as CVD, ALD, PECVD, PVD, or the like. The fill layer 130 fills the remaining portions of the recesses 106 and the openings 108 (see FIGS. 12A-12B).

As previously described, the gate dielectric layer 112 is used as an etch stop layer during the patterning of the first work function tuning layer 120 (see FIGS. 16A-16D), the second work function tuning layer 122 (see FIGS. 18A-18D), and the third work function tuning layer 124 (see FIGS. 19A-19D). Some portions of the gate dielectric layer 112 are repeatedly used as an etch stop layer. In this embodiment, the portion of the gate dielectric layer 112 in the region 50A is used as an etch stop layer three times, the portion of the gate dielectric layer 112 in the region 50C is used as an etch stop layer two times, and the portion of the gate dielectric layer 112 in the region 50D is used as an etch stop layer once. As noted above, although the etch processes are selective to the work function tuning layers 122, 124, 126, some etching of the gate dielectric layer 112 still occurs when the gate dielectric layer 112 is used as an etch stop layer during the patterning of the work function tuning layers 122, 124, 126. The crystallization process 116 (see FIGS. 14A-14D) decreases the etch rate of the gate dielectric layer 112 relative the etch processes used to pattern the work function tuning layers 122, 124, 126. Losses of the gate dielectric layer 112 during the etch processes may thus be small, especially for the portions of the gate dielectric layer 112 which are repeatedly used to stop etching. Reducing losses of the gate dielectric layer 112 may improve the performance of the resulting devices.

Although the gate electrode layers 114A, 114B, 114C, 114D are illustrated and described as having a particular configuration of the work function tuning layers 120, 122, 124, 126, the gate electrode layers 114A, 114B, 114C, 114D may have other configurations of work function tuning layers in other embodiments. For example, the gate electrode layers 114A, 114B, 114C, 114D may include more or fewer work function tuning layers, depending on the application of the devices to be formed.

Figure 23B:
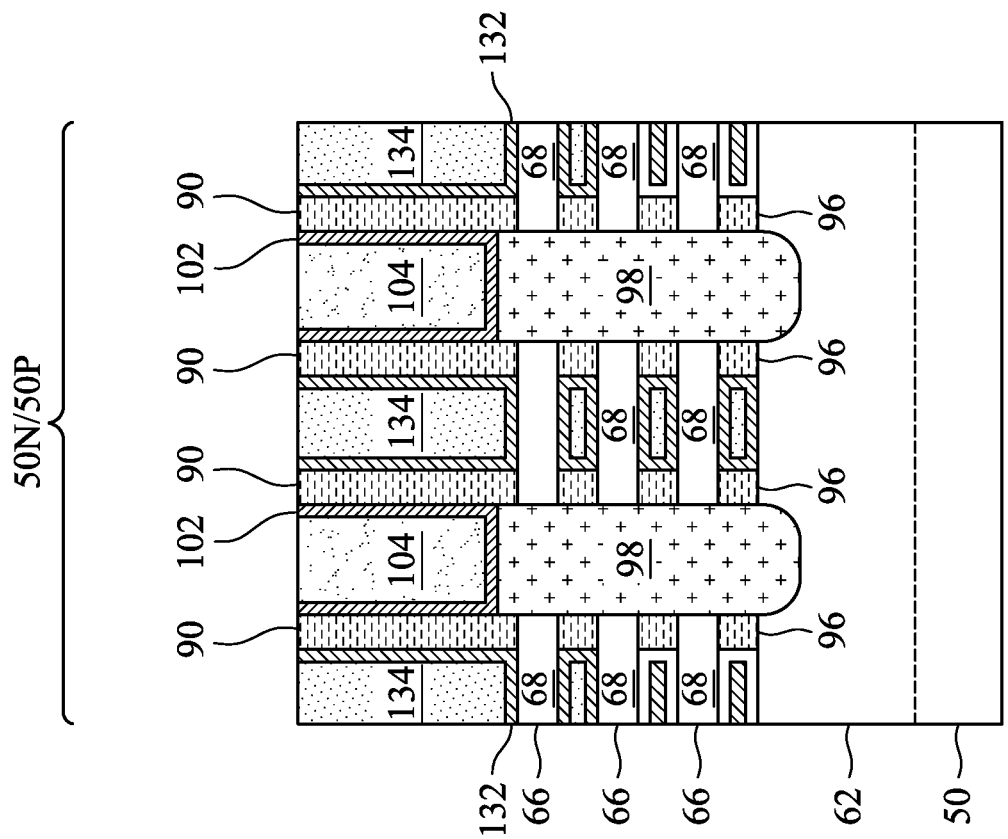
Figure 23A:
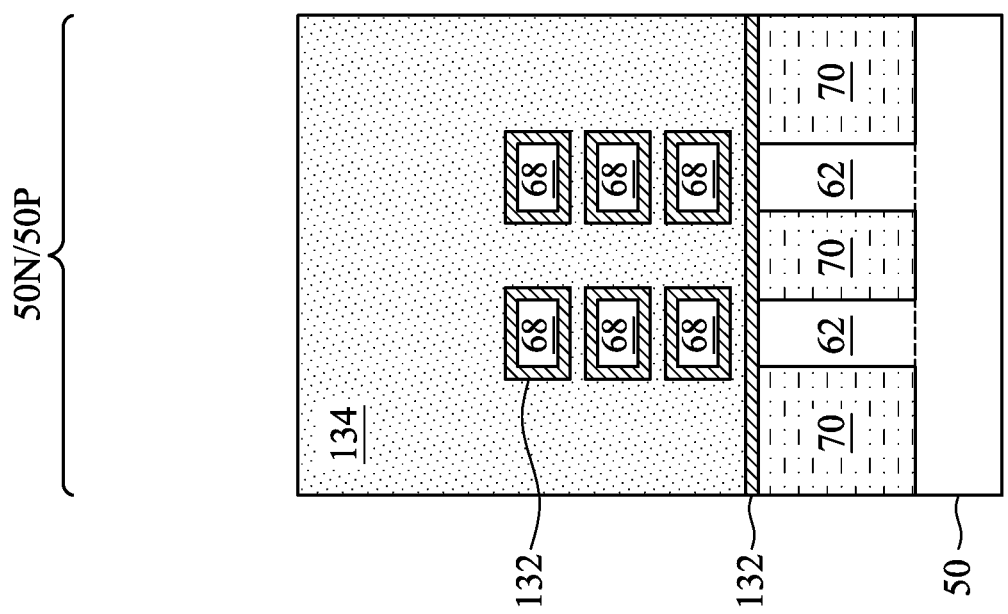

In FIGS. 23A-23B, a removal process is performed to remove the excess portions of the materials of the gate dielectric layer 112 and the gate electrode layer 114, which excess portions are over the top surfaces of the first ILD 104 and the gate spacers 90, thereby forming gate dielectrics 132 and gate electrodes 134. In some embodiments, a planarization process such as a chemical mechanical polish (CMP), an etch-back process, combinations thereof, or the like may be utilized. The gate dielectric layer 112, when planarized, has portions left in the recesses 106 and the openings 108 (thus forming the gate dielectrics 132). The gate electrode layer 114, when planarized, has portions left in the recesses 106 and the openings 108 (thus forming the gate electrodes 134). The top surfaces of the gate spacers 90; the CESL 102; the first ILD 104; the gate dielectrics 132; and the gate electrodes 134 (e.g., the fill layer 130, the glue layer 128, and the work function tuning layers 120, 122, 124, 126; see FIGS. 22A-22B) are coplanar (within process variations). The gate dielectrics 132 and the gate electrodes 134 form replacement gates of the resulting nanostructure-FETs. Each respective pair of a gate dielectric 132 and a gate electrode 134 may be collectively referred to as a "gate structure." The gate structures each extend along top surfaces, sidewalls, and bottom surfaces of a channel region 68 of the second nanostructures 66.

Figure 24B:
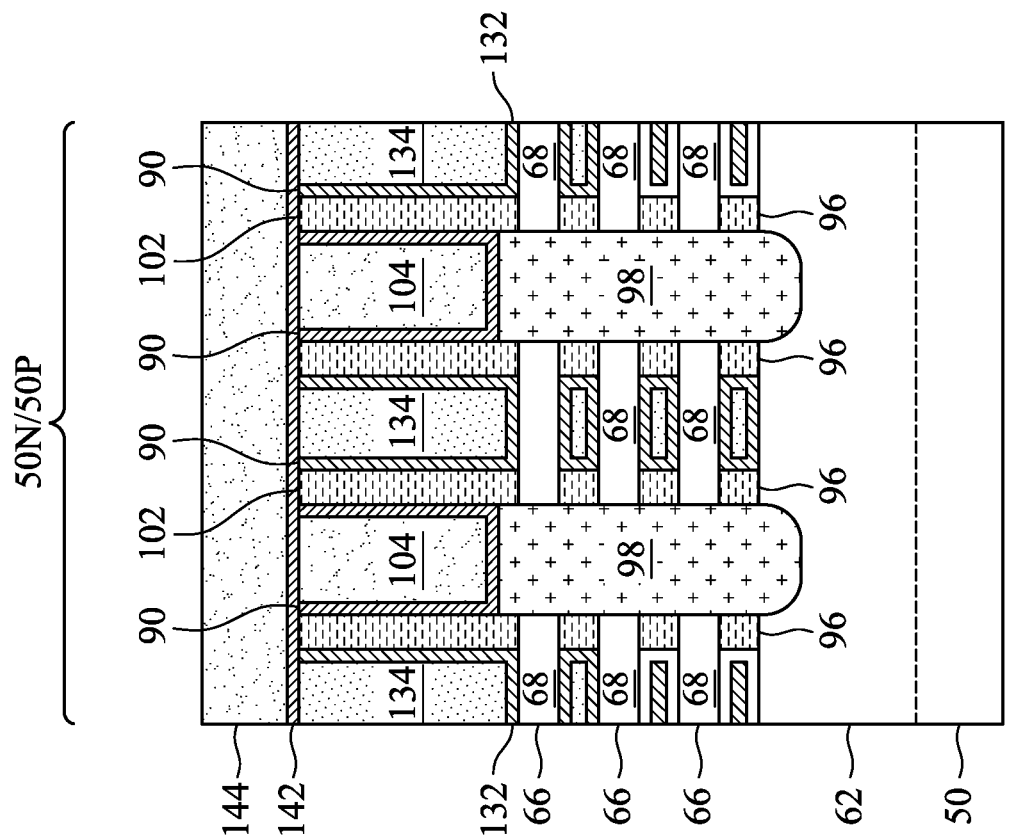
Figure 24A:
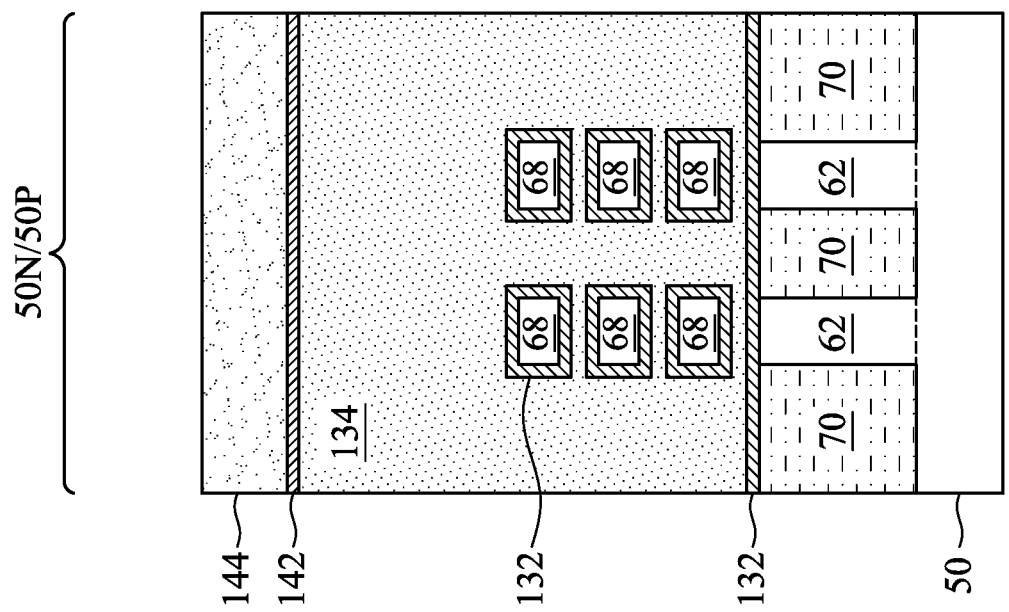

In FIGS. 24A-24B, a second ILD 144 is deposited over the gate spacers 90, the CESL 102, the first ILD 104, the gate dielectrics 132, and the gate electrodes 134. In some embodiments, the second ILD 144 is a flowable film formed by a flowable CVD method. In some embodiments, the second ILD 144 is formed of a dielectric material such as PSG, BSG, BPSG, USG, or the like, which may be formed by any suitable deposition process, such as CVD, PECVD, or the like.

In some embodiments, an etch stop layer (ESL) 142 is formed between the second ILD 144 and the gate spacers 90, the CESL 102, the first ILD 104, the gate dielectrics 132, and the gate electrodes 134. The ESL 142 may be formed of a dielectric material having a high etching selectivity from the etching of the second ILD 144, such as silicon nitride, silicon oxide, silicon oxynitride, or the like, which may be formed by any suitable deposition process, such as CVD, ALD, or the like.

Figure 25B:
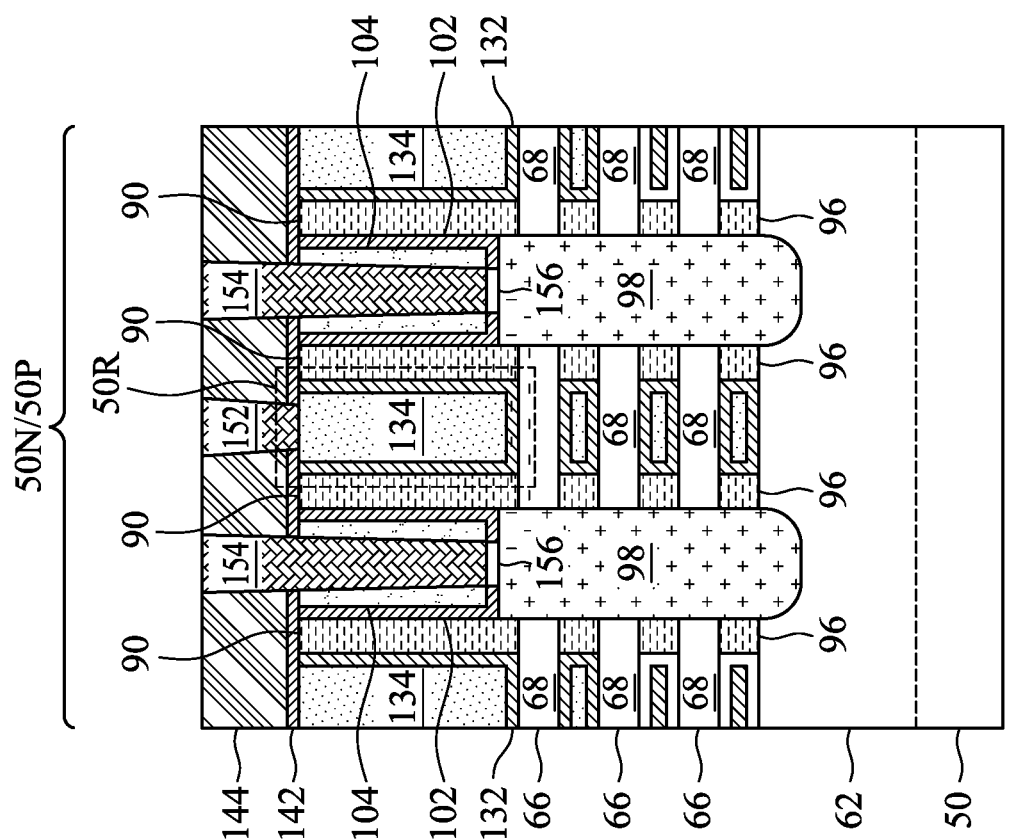
Figure 25A:
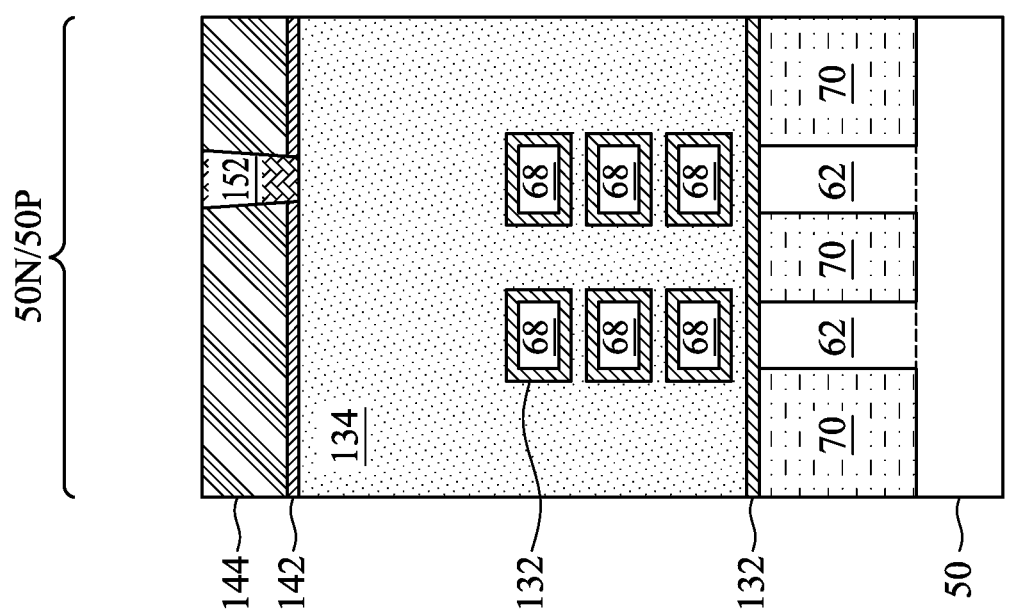

In FIGS. 25A-25B, gate contacts 152 and source/drain contacts 154 are formed to contact, respectively, the gate electrodes 134 and the epitaxial source/drain regions 98. The gate contacts 152 are physically and electrically coupled to the gate electrodes 134. The source/drain contacts 154 are physically and electrically coupled to the epitaxial source/drain regions 98.

As an example to form the gate contacts 152 and the source/drain contacts 154, openings for the gate contacts 152 are formed through the second ILD 144 and the ESL 142, and openings for the source/drain contacts 154 are formed through the second ILD 144, the ESL 142, the first ILD 104, and the CESL 102. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 144. The remaining liner and conductive material form the gate contacts 152 and the source/drain contacts 154 in the openings. The gate contacts 152 and the source/drain contacts 154 may be formed in distinct processes, or may be formed in the same process. Although shown as being formed in the same cross-sections, it should be appreciated that each of the gate contacts 152 and the source/drain contacts 154 may be formed in different cross-sections, which may avoid shorting of the contacts.

Optionally, metal-semiconductor alloy regions 156 are formed at the interfaces between the epitaxial source/drain regions 98 and the source/drain contacts 154. The metal-semiconductor alloy regions 156 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon germanide regions formed of both a metal silicide and a metal germanide, or the like. The metal-semiconductor alloy regions 156 can be formed before the material(s) of the source/drain contacts 154 by depositing a metal in the openings for the source/drain contacts 154 and then performing a thermal anneal process. The metal can be any metal capable of reacting with the semiconductor materials (e.g., silicon, silicon carbide, silicon germanium, germanium, etc.) of the epitaxial source/drain regions 98 to form a low-resistance metal-semiconductor alloy, such as nickel, cobalt, titanium, tantalum, platinum, tungsten, other noble metals, other refractory metals, rare earth metals, or their alloys. The metal may be formed by a deposition process such as ALD, CVD, PVD, or the like. After the thermal anneal process, a cleaning process, such as a wet clean, may be performed to remove any residual metal from the openings for the source/drain contacts 154, such as from surfaces of the metal-semiconductor alloy regions 156. The material(s) of the source/drain contacts 154 can then be formed on the metal-semiconductor alloy regions 156.

Figure 26B:
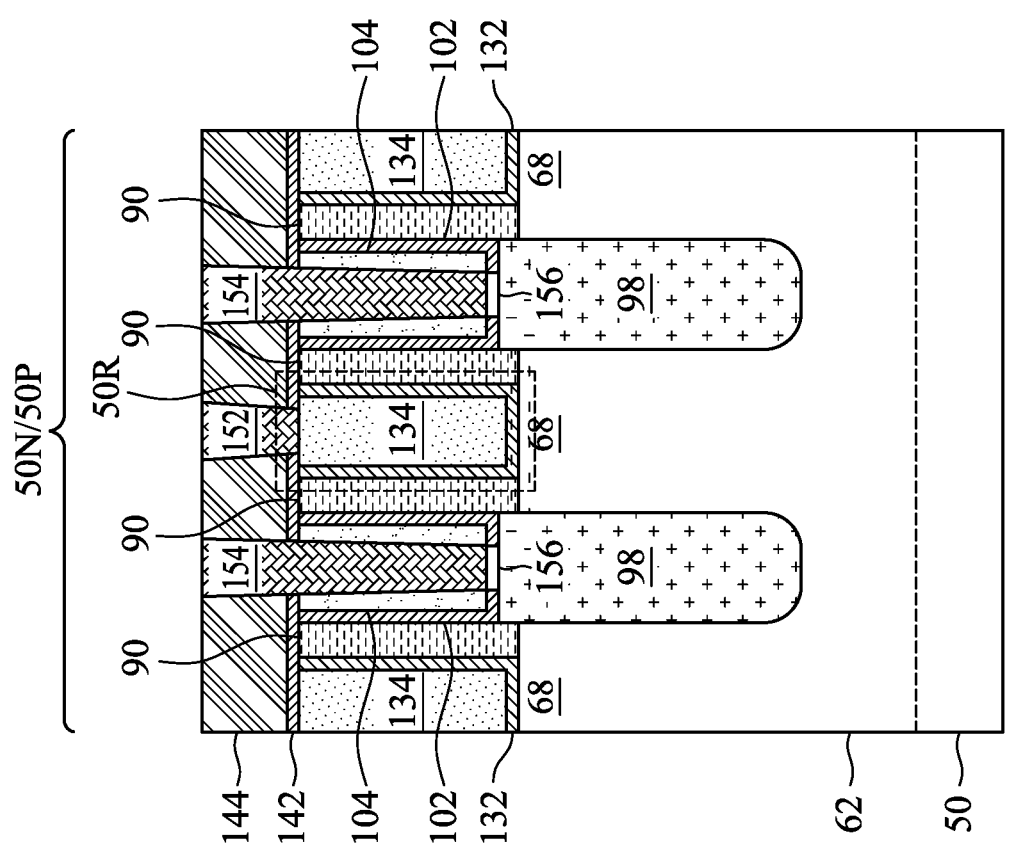
FIGS. 26A-26B are views of FinFETs, in accordance with some embodiments.
Figure 26A:
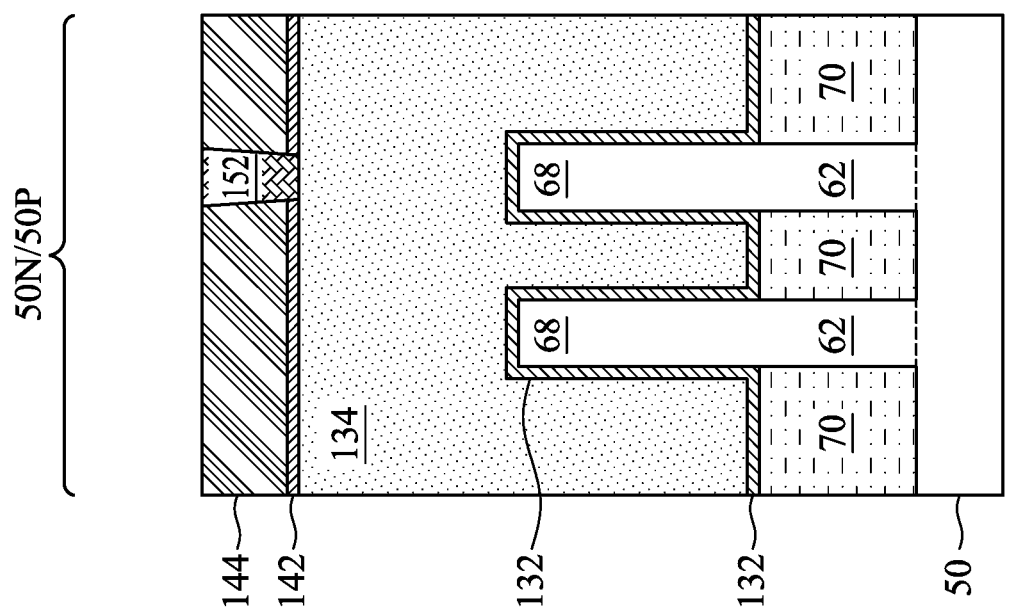

FIGS. 26A-26B are views of FinFETs, in accordance with some embodiments. The FinFETs may be manufactured by a similar process as the nanostructure-FETs previously described, except the nanostructures 64, 66 are omitted. Instead, the fins 62 are semiconductor features which act as channel regions 68 for the FinFETs. The gate structures (including the gate dielectrics 132 and the gate electrodes 134) are formed to extend along the top surfaces and the sidewalls of the channel regions 68 of the fins 62.

FIGS. 28A-28D are views of devices, in accordance with some embodiments. FIGS. 28A-28D are detailed views of a portion 50R of either FIG. 25B (in which case the illustrated devices are nanostructure-FETs) or FIG. 26B (in which case the illustrated devices are FinFETs); in either case, the devices in the different regions 50A, 50B, 50C, 50D (previously described) are shown. As can be seen, the gate electrodes 134A, 134B, 134C, 134D in the regions 50A, 50B, 50C, 50D each have different configurations of the work function tuning layers 120, 122, 124, 126. Further, the gate dielectrics 132 in the regions 50A, 50B, 50C, 50D have different thicknesses $T_1$, $T_2$, $T_3$, $T_4$ (previously described) as a result of the repeated etching processes the gate dielectrics 132 are subjected to. Advantageously, as a result of the crystallization process 116 (see FIGS. 14A-14D) the difference between the largest thickness $T_1$ and the smallest thickness $T_4$ is small. In some embodiments, the smallest thickness $T_4$ is from 85% to 100% of the largest thickness $T_1$. Reducing losses of the gate dielectrics 132 during etching may improve the performance of the resulting devices.

In some embodiments, the gate electrodes 134A, 134B, 134C, 134D are part of a same metal gate line. For example, a metal gate line can include a first portion (corresponding to the gate electrode 134A) on a first channel region 68, a second portion (corresponding to the gate electrode 134B) on a second channel region 68, a third portion (corresponding to the gate electrode 134C) on a third channel region 68, and a fourth portion (corresponding to the gate electrode 134D) on a fourth channel region 68. In some embodiments, the gate electrodes 134A, 134B, 134C, 134D are part of different metal gate lines.

In the previously described embodiments, the gate dielectric layer 112 (see FIGS. 14A-14D) is a same continuous dielectric layer which is deposited in the openings 108 and/or the recesses 106 (see FIGS. 12A-12B) in each of the regions 50A, 50B, 50C, 50D. FIGS. 29A-30D illustrate another process in which gate dielectric layers 112 and gate electrode layers 114 for replacement gates are formed in the openings 108 and/or the recesses 106, in accordance with some embodiments. FIGS. 29A-30D are detailed views of a portion 50R of either FIG. 25B (in which case the illustrated devices are nanostructure-FETs) or FIG. 26B (in which case the illustrated devices are FinFETs); in either case, the devices in different regions 50A, 50B, 50C, 50D (previously described) are shown. In this embodiment, different gate dielectric layers 112A, 112B, 112C, 112D are formed in the regions 50A, 50B, 50C, 50D by distinct processes, such that the gate dielectric layers 112A, 112B, 112C, 112D include different materials and/or have a different number of sublayers.

In FIGS. 29A-29D, the gate dielectric layers 112A, 112B, 112C, 112D are conformally formed on the channel regions 68 in the regions 50A, 50B, 50C, 50D, such that they conformally line the recesses 106 and the openings 108 (see FIGS. 12A-12B). Some or all of the gate dielectric layers 112A, 112B, 112C, 112D may be formed of different dielectric material(s). Further, some or all of the gate dielectric layers 112A, 112B, 112C, 112D may have different work functions. An example of how different gate dielectric layers 112 may be formed in different regions will be subsequently described in greater detailed for FIGS. 34A-39C.

During formation of the gate dielectric layers 112A, 112B, 112C, 112D, one or more crystallization process(es) 116 are performed to decrease the etch rate of the gate dielectric layers 112A, 112B, 112C, 112D relative etch processes used to pattern overlying work function tuning layers. Each crystallization process 116 may be performed in a similar manner as described above for FIGS. 14A-14D. In some embodiments, a respective crystallization process 116A, 116B, 116C, 116D is performed after or during the formation of each respective gate dielectric layer 112A, 112B, 112C, 112D. In some embodiments, a single crystallization process 116 is performed after the formation of each of the gate dielectric layers 112A, 112B, 112C, 112D. Because the gate dielectric layers 112A, 112B, 112C, 112D are formed in different processes, some or all the gate dielectric layers 112A, 112B, 112C, 112D may have different thicknesses. In some embodiments, the gate dielectric layers 112A, 112B, 112C, 112D have thicknesses $T_{1A}$, $T_{1B}$, $T_{1C}$, $T_{1D}$, respectively, which are each in the range of 11 Å to 14 Å after the crystallization process(es) 116A, 116B, 116C, 116D, respectively.

In FIGS. 30A-30D, appropriate steps as previously described are performed to complete formation of the devices. The resulting gate dielectrics 132A, 132B, 132C, 132D include the remaining portions of the dielectric layers 112A, 112B, 112C, 112D in the respective regions 50A, 50B, 50C, 50D.

Figure 32B:
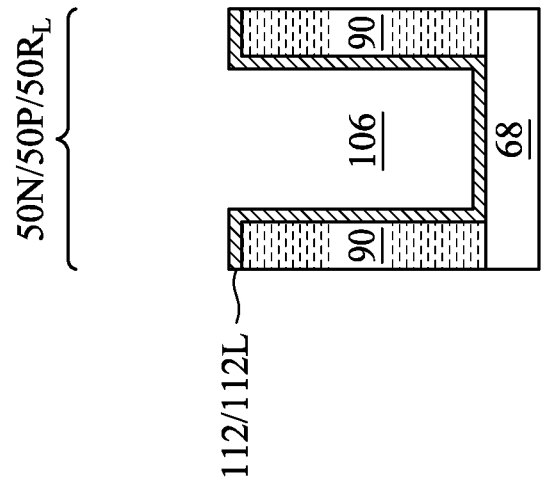
FIGS. 32A-33B are views of intermediate stages in the manufacturing of devices, in accordance with some embodiments.
Figure 32A:
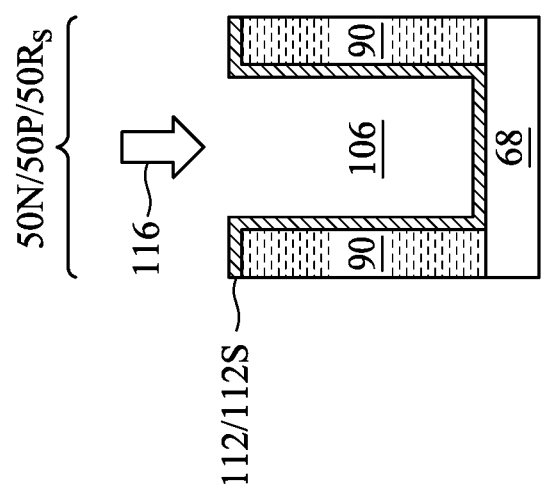
Figure 33B:
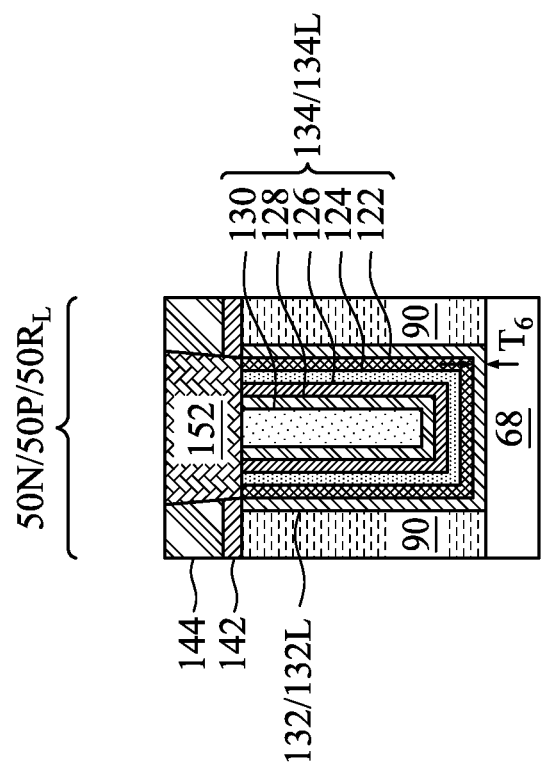
Figure 33A:
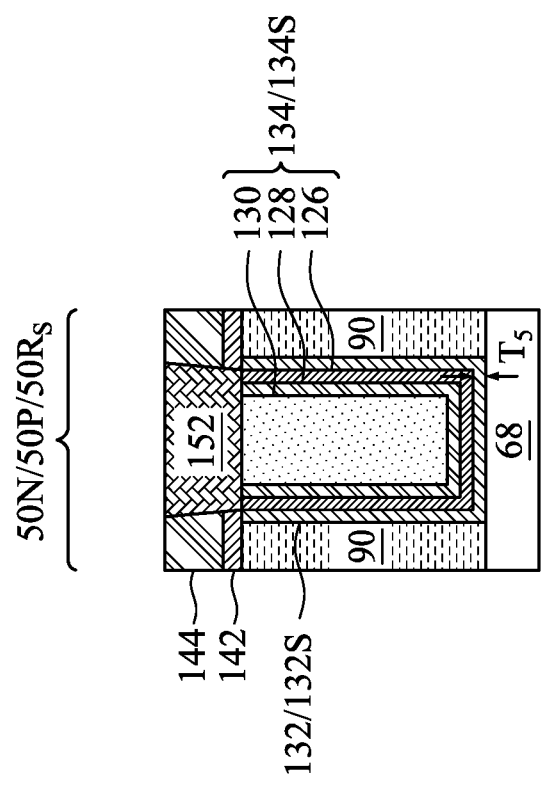

FIGS. 31A-31B are views of devices, in accordance with some other embodiments. In this embodiment, a die includes nanostructure-FETs in combination with FinFETs. For example, a region 50S contains small devices such as nanostructure-FETs, and a region 50L contains large devices such as FinFETs. In this context, the size of a device refers to the channel length of the device. Thus, the FinFETs have longer channel lengths (and thus wider gate structures) than the nanostructure-FETs. FIGS. 32A-33B illustrate another process in which gate dielectric layers 112 and gate electrode layers 114 for replacement gates of the devices are formed, in accordance with some embodiments. FIGS. 32A and 33A are detailed views of a region $50R_S$ in FIG. 31A, and FIGS. 32B and 33B are detailed views of a region $50R_L$ in FIG. 31B. In this embodiment, different gate dielectric layers 112L, 112S are formed in the regions 50S, 50L by distinct processes, such that the gate dielectric layers 112L, 112S have different crystalline structures.

In FIGS. 32A-32B, the gate dielectric layers 112L, 112S are conformally formed on the channel regions 68 in the regions $50R_S$, $50R_L$, such that they conformally line the openings 108 and/or the recesses 106 (see FIGS. 12A-12B). The dielectric layer 112S is formed to have a greater crystallinity than the gate dielectric layer 112L, so that the dielectric layer 112S may be repeatedly used to stop more etch processes than the gate dielectric layer 112L. Because the devices in the region $50R_L$ have longer channel lengths than the devices in the region $50R_S$, the recesses 106 in the region $50R_L$ have greater width than the recesses 106 in the region $50R_S$. As will be subsequently described in greater detail, gate structures with more work function tuning layers may be formed in larger recesses 106, and gate structures with less work function tuning layers may be formed in smaller recesses 106. In such embodiments, the gate dielectric layer 112S may be repeatedly used to stop etch processes when patterning the work function tuning layers for the gate dielectric layer 112L. Forming the dielectric layer 112S to have a greater crystallinity than the gate dielectric layer 112L may help avoid losses of the gate dielectric layer 112L during the etch process.

In some embodiments, the gate dielectric layers 112L, 112S are formed by depositing a same continuous dielectric layer in the recesses 106 in each of the regions $50R_S$, $50R_L$. The portions of the dielectric layer in the region $50R_S$ are then treated by a crystallization process 116 to increase their crystallinity. In some embodiments, the portions of the dielectric layer in the region $50R_L$ are not treated by a crystallization process, such that the gate dielectric layer 112L is an amorphous high-k dielectric layer and the gate dielectric layer 112S is a crystalline high-k dielectric layer. In other embodiments, the portions of the dielectric layer in the region $50R_L$ are also treated by a crystallization process (not separately illustrated), such that the gate dielectric layer 112L and the gate dielectric layer 112S are both crystalline high-k dielectric layers. In either case, the portions of the dielectric layer in the region $50R_S$ have a greater crystallinity than the portions of the dielectric layer in the region $50R_L$. The gate dielectric layer 112S includes the portions of the dielectric layer in the region $50R_S$, and the gate dielectric layer 112L includes the portions of the dielectric layer in the region $50R_L$.

In FIGS. 33A-33B, appropriate steps as previously described are performed to complete formation of the devices. The resulting gate dielectrics 132L, 132S include the remaining portions of the dielectric layers 112L, 112S in the respective regions $50R_S$, $50R_L$. The gate electrode 134L in the region $50R_L$ has more work function tuning layers than the gate electrode 134S in the region $50R_S$. As such, the gate dielectric layer 112S is used to stop more etch processes than the gate dielectric layer 112L. The gate dielectrics 132S are thus thinner than the gate dielectrics 132L. In some embodiments, the gate dielectrics 132S have a thickness $T_5$ in the range of 11 Å to 14 Å, and the gate dielectrics 132L have a thickness $T_6$ in the range of 11 Å to 14 Å. Similar to the previously described embodiments, the gate electrodes 134L, 134S may be part of a same metal gate line or may be part of different metal gate lines.

In the illustrated embodiment, the gate electrode 134L and the gate electrode 134S both include a first work function material (e.g., the fourth work function tuning layer 126), and the gate electrode 134L further includes a second work function material (e.g., the third work function tuning layer 124) and a third work function material (e.g., the second work function tuning layer 122) which are not included in the gate electrode 134S. The gate electrode 134S is thus free from the second and third work function materials. The additional work function materials in the gate electrode 134L are disposed beneath the first work function material (e.g., the fourth work function tuning layer 126), as a result of the previously described depositing and patterning processes. Although the gate electrodes 134L, 134S are illustrated and described as having a particular configuration of the work function tuning layers 122, 124, 126, the gate electrode electrodes 134L, 134S may have other configurations of work function tuning layers in other embodiments.

Embodiments may achieve advantages. Performing the crystallization process(es) 116 on the gate dielectric layer(s) 112 decreases the etch rate of the gate dielectric layer(s) 112 relative the etch processes used to pattern the work function tuning layers 122, 124, 126. Losses of the gate dielectric layer 112 during the etch processes may thus be small, especially for portions of the gate dielectric layer 112 which are repeatedly used to stop etching. Reducing losses of the gate dielectric layer 112 may improve the performance of the resulting devices. Utilizing a microsecond anneal process for the crystallization process(es) 116 can help reduce short-channel effects, such as drain-induced barrier lowering (DIBL), in the resulting devices.

FIGS. 34A-39C illustrate a process in which gate dielectric layers 112 for replacement gates are formed in the openings 108 and/or the recesses 106 (see FIGS. 12A-12B), in accordance with some embodiments. In this embodiment, the gate dielectric layers 112E, 112F, 112G are formed in three regions 50E, 50F, 50G. FIGS. 34A-39C are detailed views of a portion 50R of FIG. 13B, showing the different regions 50E, 50F, 50G. It should be appreciated that any desired quantity of gate dielectric layers 112 may be formed in any desired quantity of regions, such as by repeating appropriate deposition and/or patterning process which will be subsequent described.

In FIGS. 34A-34C, a gate dielectric layer 112 is conformally deposited on the channel regions 68 in the regions 50E, 50F, 50G. In this embodiment, the gate dielectric layer 112 is a same continuous dielectric layer which is deposited in the openings 108 and/or the recesses 106 in each of the regions 50E, 50F, 50G. Thus, the gate dielectric layer 112 is initially formed of the same material in each of the regions 50E, 50F, 50G. The gate dielectric layer 112 may be formed of the materials and by the methods described for FIGS. 14A-14D.

A first doping layer 162 is then conformally formed on the gate dielectric layer 112. The first doping layer 162 is formed of a material that includes a desired work function tuning element that is acceptable to tune a work function of a device to a desired amount given the application of the device to be formed, such as an oxide of the work function tuning element, and may be formed by any acceptable deposition process. In some embodiments, the first doping layer 162 is formed of lanthanum oxide, aluminum oxide, zinc oxide, magnesium oxide, yttrium oxide, or the like, which may be formed by PVD, ALD, CVD, or the like.

In some embodiments after the first doping layer 162 is formed, a crystallization process 116 is performed to decrease the etch rate of the gate dielectric layer 112 relative etch processes used to pattern overlying work function tuning layers. The crystallization process 116 may be performed in a similar manner as described above for FIGS. 14A-14D. In another embodiment, no crystallization process is performed at this step of processing.

Figure 35B:
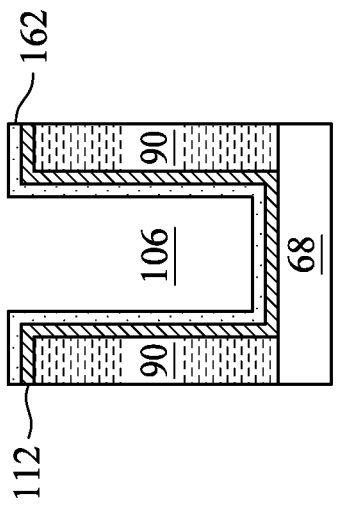
Figure 35C:
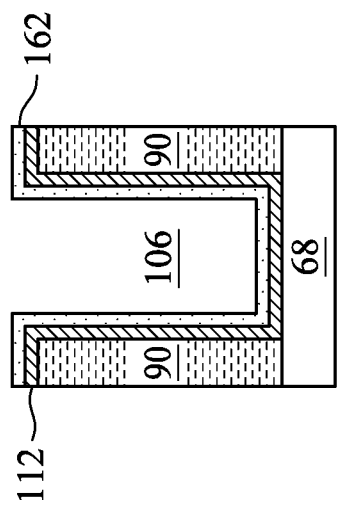
Figure 35A:
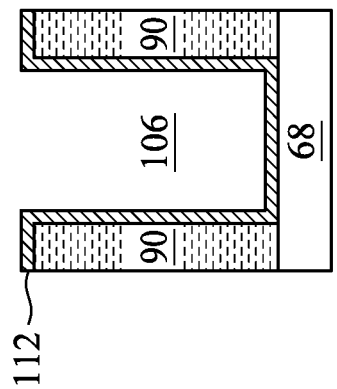

In FIGS. 35A-35C, the first doping layer 162 is patterned to remove portions of the first doping layer 162 in some regions. In this embodiment, the portions of the first doping layer 162 in the region 50E are removed, so that the first doping layer 162 remains in the regions 50F, 50G. The first doping layer 162 may be patterned by any acceptable etch process, using an etching mask (not separately illustrated) such as a photoresist. For example, a photoresist may be formed over the first doping layer 162 and patterned to expose portions of the first doping layer 162. The photoresist can be formed by using a spin-on technique and can be patterned using acceptable photolithography techniques. Once the photoresist is patterned, the etch process is performed using the photoresist as an etching mask to remove the exposed portions of the first doping layer 162. The etch process is selective to the first doping layer 162 (e.g., selectively etches the material of the first doping layer 162 at a faster rate than the material(s) of the gate dielectric layer 112). The etch process may be isotropic. In some embodiments, the first doping layer 162 is etched by a wet etch using SC-1 (a mixture of ammonium hydroxide, hydrogen peroxide, and water), SC-2 (a mixture of deionized water, hydrochloric acid, and hydrogen peroxide), or hydrogen peroxide as etchants. The gate dielectric layer 112 is used as an etch stop layer during the etch process, such that the gate dielectric layer 112 is exposed to the etchant(s) at the end of the etch process. After the etch process, the photoresist may be removed, such as by any acceptable ashing process.

In FIGS. 36A-36C, a second doping layer 164 is conformally formed on the first doping layer 162 and the gate dielectric layer 112. The second doping layer 164 is formed of a material that includes a desired work function tuning element that is acceptable to tune a work function of a device to a desired amount given the application of the device to be formed, such as an oxide of the work function tuning element, and may be formed by any acceptable deposition process. In some embodiments, the second doping layer 164 is formed of lanthanum oxide, aluminum oxide, zinc oxide, magnesium oxide, yttrium oxide, or the like, which may be formed by PVD, ALD, CVD, or the like. The second doping layer 164 may include a different work function tuning element than the first doping layer 162, or may be formed of the same material as the first doping layer 162.

In some embodiments after the second doping layer 164 is formed, a crystallization process 116 is performed to decrease the etch rate of the gate dielectric layer 112 relative etch processes used to pattern overlying work function tuning layers. The crystallization process 116 may be performed in a similar manner as described above for FIGS. 14A-14D. In another embodiment, no crystallization process is performed at this step of processing.

In FIGS. 37A-37C, the second doping layer 164 is patterned to remove portions of the second doping layer 164 in some regions. Optionally, some portions of the first doping layer 162 may also be patterned concurrently with the patterning of the second doping layer 164. In this embodiment, the portions of the second doping layer 164 in the region 50F are removed, so that the second doping layer 164 remains in the regions 50E, 50G. The second doping layer 164 may be patterned by any acceptable etch process, using an etching mask (not separately illustrated) such as a photoresist. For example, a photoresist may be formed over the second doping layer 164 and patterned to expose portions of the second doping layer 164. The photoresist can be formed by using a spin-on technique and can be patterned using acceptable photolithography techniques. Once the photoresist is patterned, the etch process is performed using the photoresist as an etching mask to remove the exposed portions of the second doping layer 164. The etch process is selective to the second doping layer 164 (e.g., selectively etches the material of the second doping layer 164 at a faster rate than the material of the first doping layer 162 and/or the gate dielectric layer 112). The etch process may be isotropic. In some embodiments, the second doping layer 164 is etched by a wet etch using SC-1 (a mixture of ammonium hydroxide, hydrogen peroxide, and water), SC-2 (a mixture of deionized water, hydrochloric acid, and hydrogen peroxide), or hydrogen peroxide as etchants. The gate dielectric layer 112 and/or the first doping layer 162 are used as etch stop layers during the etch process, such that those layer(s) are exposed to the etchant(s) at the end of the etch process. After the etch process, the photoresist may be removed, such as by any acceptable ashing process.

In FIGS. 38A-38C, the work function tuning element(s) in the second doping layer 164 and the first doping layer 162 are driven into the gate dielectric layer 112. In some embodiments, the work function tuning element(s) are driven into the gate dielectric layer 112 by annealing the gate dielectric layer 112, the first doping layer 162, and the second doping layer 164 at a temperature in the range of 500° C. to 700° C., and for a duration in the range of 1.5 second to 30 seconds. The anneal process for driving the work function tuning element(s) into the gate dielectric layer 112 is performed at a lower temperature and for a longer duration than the anneal process(es) for the crystallization process(es) 116 (previously described).

Driving the work function tuning element(s) into the gate dielectric layer 112 forms the gate dielectric layers 112E, 112F, 112G. The resulting gate dielectric layers 112E, 112F, 112G include the portions of the gate dielectric layer 112 that the work function tuning element(s) were driven into. In some embodiments, where the first doping layer 162 and the second doping layer 164 include the same work function tuning element, the gate dielectric layers 112E, 112F, 112G include different quantities of that work function tuning element. For example, the gate dielectric layer 112G can have a greater concentration of the work function tuning element than the gate dielectric layer 112E, as a result of more doping layers being formed on the gate dielectric layer 112G than on the gate dielectric layer 112E. In some embodiments, where the first doping layer 162 and the second doping layer 164 include different work function tuning elements, the gate dielectric layers 112E, 112F, 112G include different types of work function tuning elements. For example, the gate dielectric layer 112G can have more types of work function tuning elements than the gate dielectric layer 112E, as a result of more doping layers being formed on the gate dielectric layer 112G than on the gate dielectric layer 112E.

In some embodiments after the work function tuning element(s) are driven into the gate dielectric layer 112, a crystallization process 116 is performed to decrease the etch rate of the gate dielectric layer 112 relative etch processes used to pattern overlying work function tuning layers. The crystallization process 116 may be performed in a similar manner as described above for FIGS. 14A-14D. In another embodiment, no crystallization process is performed at this step of processing.

In FIGS. 39A-39C, remaining portions of the second doping layer 164 and the first doping layer 162 are removed. The remaining portions of the second doping layer 164 and the first doping layer 162 may be removed by etching the second doping layer 164 and the first doping layer 162. The etch process is selective to the second doping layer 164 and the first doping layer 162 (e.g., selectively etches the material(s) of the second doping layer 164 and the first doping layer 162 at a faster rate than the material(s) of the gate dielectric layer 112). The etch process may be anisotropic. In some embodiments, the second doping layer 164 and the first doping layer 162 are etched by a wet etch using a hydrochloric acid peroxide mixture (HPM), a mixture of hydrogen peroxide and ammonium hydroxide, or the like.

In some embodiments after the remaining portions of the second doping layer 164 and the first doping layer 162 are removed, a crystallization process 116 is performed to decrease the etch rate of the gate dielectric layer 112 relative etch processes used to pattern overlying work function tuning layers. The crystallization process 116 may be performed in a similar manner as described above for FIGS. 14A-14D. In another embodiment, no crystallization process is performed after the remaining portions of the second doping layer 164 and the first doping layer 162 are removed.

In some embodiments, each of the crystallization processes 116 described for FIGS. 34A-34C, 36A-36C, 38A-38C, and 39A-39C are performed. In some embodiments, some or all of those crystallization processes 116 are omitted. For example, in some embodiments only the crystallization process 116 described for FIGS. 39A-39C is performed, and the crystallization processes 116 described for FIGS. 34A-34C, 36A-36C, and 38A-38C are omitted. More generally, only one of the crystallization processes 116 described for FIGS. 34A-34C, 36A-36C, 38A-38C, and 39A-39C may be performed.

In an embodiment, a device includes: a first gate dielectric on a first channel region of a first semiconductor feature; a first gate electrode on the first gate dielectric; a second gate dielectric on a second channel region of a second semiconductor feature, the second gate dielectric having a greater crystallinity than the first gate dielectric; and a second gate electrode on the second gate dielectric. In some embodiments of the device, the first semiconductor feature is a fin and the second semiconductor feature is a nanostructure. In some embodiments of the device, the first channel region is longer than the second channel region. In some embodiments of the device, the second gate dielectric is thinner than the first gate dielectric. In some embodiments of the device, the first gate electrode includes more work function tuning layers than the second gate electrode. In some embodiments of the device, the first gate electrode includes a first work function material and a second work function material, the second gate electrode includes the second work function material, and the second gate electrode is free from the first work function material. In some embodiments of the device, the first gate dielectric is an amorphous high-k dielectric layer and the second gate dielectric is a crystalline high-k dielectric layer. In some embodiments of the device, the first gate dielectric is a first crystalline high-k dielectric layer and the second gate dielectric is a second crystalline high-k dielectric layer. In some embodiments of the device, the first gate electrode and the second gate electrode are part of a same metal gate line. In some embodiments of the device, the first gate electrode and the second gate electrode are part of different metal gate lines.

In an embodiment, a method includes: depositing an amorphous high-k dielectric layer on a semiconductor feature; annealing the amorphous high-k dielectric layer to form a crystalline high-k dielectric layer; depositing a first work function tuning layer on the crystalline high-k dielectric layer; patterning the first work function tuning layer by etching the first work function tuning layer using the crystalline high-k dielectric layer as an etch stop layer; depositing a second work function tuning layer on the first work function tuning layer and the crystalline high-k dielectric layer; and patterning the second work function tuning layer by etching the second work function tuning layer using the first work function tuning layer and the crystalline high-k dielectric layer as etch stop layers. In some embodiments of the method, etching the first work function tuning layer reduces a thickness of the crystalline high-k dielectric layer. In some embodiments of the method, the crystalline high-k dielectric layer is thicker than the amorphous high-k dielectric layer. In some embodiments of the method, annealing the amorphous high-k dielectric layer includes performing a microsecond anneal process. In some embodiments of the method, the microsecond anneal process is performed at a temperature in a range of 1000° C. to 1150° C. and for a duration in a range of 1.2 milliseconds to 12 milliseconds. In some embodiments of the method, the amorphous high-k dielectric layer has a crystallinity in a range of 5% to 30% and the crystalline high-k dielectric layer has a crystallinity in a range of 60% to 100%.

In an embodiment, a method includes: depositing a gate dielectric layer on a first channel region and a second channel region; decreasing an etch rate of the gate dielectric layer relative an etching process; depositing a first metal layer on the gate dielectric layer; removing a first portion of the first metal layer overlying the first channel region by etching the first metal layer with the etching process, a second portion of the first metal layer remaining over the second channel region; and depositing a second metal layer on the second portion of the first metal layer and the gate dielectric layer. In some embodiments of the method, decreasing the etch rate of the gate dielectric layer includes crystallizing the gate dielectric layer. In some embodiments of the method, the gate dielectric layer is crystallized to have a tetragonal or orthorhombic crystalline phase, and a crystalline grain size in a range of 3 nm to 25 nm. In some embodiments of the method, the gate dielectric layer includes hafnium oxide, the first metal layer includes titanium aluminide, and the etching process includes a wet etch using SC-1, SC-2, or hydrogen peroxide as etchants.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing an amorphous high-k dielectric layer on a semiconductor feature;
annealing the amorphous high-k dielectric layer to form a crystalline high-k dielectric layer;
depositing a first work function tuning layer on the crystalline high-k dielectric layer;
patterning the first work function tuning layer by etching the first work function tuning layer using the crystalline high-k dielectric layer as an etch stop layer;
depositing a second work function tuning layer on the first work function tuning layer and the crystalline high-k dielectric layer; and
patterning the second work function tuning layer by etching the second work function tuning layer using the first work function tuning layer and the crystalline high-k dielectric layer as etch stop layers.

2. The method of claim 1, wherein etching the first work function tuning layer reduces a thickness of the crystalline high-k dielectric layer.

3. The method of claim 1, wherein the crystalline high-k dielectric layer is thicker than the amorphous high-k dielectric layer.

4. The method of claim 1, wherein annealing the amorphous high-k dielectric layer comprises performing a microsecond anneal process.

5. The method of claim 4, wherein the microsecond anneal process is performed at a temperature in a range of 1000° C. to 1150° C. and for a duration in a range of 1.2 milliseconds to 12 milliseconds.

6. The method of claim 1, wherein the amorphous high-k dielectric layer has a crystallinity in a range of 5% to 30% and the crystalline high-k dielectric layer has a crystallinity in a range of 60% to 100%.

7. A method comprising:
depositing a gate dielectric layer on a first channel region and a second channel region;
performing a treatment process on the gate dielectric layer;
depositing a first metal layer on the gate dielectric layer;
removing a first portion of the first metal layer overlying the first channel region by etching the first metal layer with an etching process, a second portion of the first metal layer remaining over the second channel region, wherein the treatment process decreases an etch rate of the gate dielectric layer during the etching process; and
depositing a second metal layer on the second portion of the first metal layer and the gate dielectric layer.

8. The method of claim 7, wherein performing the treatment process on the gate dielectric layer comprises crystallizing the gate dielectric layer.

9. The method of claim 8, wherein the gate dielectric layer is crystallized to have a tetragonal or orthorhombic crystalline phase, and a crystalline grain size in a range of 3 nm to 25 nm.

10. The method of claim 7, wherein the gate dielectric layer comprises hafnium oxide, the first metal layer comprises titanium aluminide, and the etching process comprises a wet etch using SC-1, SC-2, or hydrogen peroxide as etchants.

11. A method comprising:
depositing a gate dielectric layer having a first portion over a first channel region and having a second portion over a second channel region, the first channel region being longer than the second channel region;
performing a crystallization process to increase a crystallinity of the second portion of the gate dielectric layer to be greater than a crystallinity of the first portion of the gate dielectric layer; and
forming a first gate electrode and a second gate electrode, the first gate electrode formed over the first portion of the gate dielectric layer, the second gate electrode formed over the second portion of the gate dielectric layer, the first gate electrode comprising more work function tuning layers than the second gate electrode.

12. The method of claim 11, wherein performing the crystallization process changes a crystalline phase of the second portion of the gate dielectric layer to be different than a crystalline phase of the first portion of the gate dielectric layer.

13. The method of claim 11, wherein performing the crystallization process changes a crystalline orientation of the second portion of the gate dielectric layer to be different than a crystalline orientation of the first portion of the gate dielectric layer.

14. The method of claim 11, wherein performing the crystallization process changes a crystalline grain size of the second portion of the gate dielectric layer to be different than a crystalline grain size of the first portion of the gate dielectric layer.

15. The method of claim 11, wherein the crystallization process comprises a microsecond anneal process.

16. The method of claim 11, further comprising:
forming a fin comprising the first channel region; and
forming a nanostructure comprising the second channel region.

17. The method of claim 11, wherein after forming the first gate electrode and the second gate electrode, the second portion of the gate dielectric layer is thinner than the first portion of the gate dielectric layer.

18. The method of claim 11, wherein forming the first gate electrode and the second gate electrode comprises:
forming a first work function tuning layer over the gate dielectric layer;
removing the first work function tuning layer from the second portion of the gate dielectric layer, the first work function tuning layer remaining over the first portion of the gate dielectric layer; and
forming a second work function tuning layer over the first work function tuning layer and the gate dielectric layer.

19. The method of claim 11, wherein the first gate electrode and the second gate electrode are formed as part of a same metal gate line.

20. The method of claim 11, wherein the first gate electrode and the second gate electrode are formed as parts of different metal gate lines.

* * * * *